(12) United States Patent
Lee et al.

(10) Patent No.: US 11,882,663 B2
(45) Date of Patent: Jan. 23, 2024

(54) METHOD OF MANUFACTURING DISPLAY DEVICE AND DISPLAY DEVICE MANUFACTURED USING THE SAME

(71) Applicant: Samsung Display Co., LTD., Yongin-si (KR)

(72) Inventors: Jun Young Lee, Yongin-si (KR); Youn Woong Kang, Yongin-si (KR); Min Sang Koo, Yongin-si (KR); Si Joon Song, Yongin-si (KR); Dong Hyun Lee, Yongin-si (KR); Jae Hak Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/892,709

(22) Filed: Aug. 22, 2022

(65) Prior Publication Data

US 2023/0164967 A1 May 25, 2023

(30) Foreign Application Priority Data

Nov. 19, 2021 (KR) ........................ 10-2021-0160428

(51) Int. Cl.
*H05K 3/00* (2006.01)
*H05K 1/18* (2006.01)

(52) U.S. Cl.
CPC ........... *H05K 3/0091* (2013.01); *H05K 1/189* (2013.01)

(58) Field of Classification Search
CPC ........ H05K 3/0091; H05K 1/189; G02F 1/13; H10K 59/8722; H10K 59/131; H10K 71/00; H10K 50/841; H10K 50/844
See application file for complete search history.

(56) References Cited

U.S. PATENT DOCUMENTS

| 6,862,053 | B2 | 3/2005 | Lee et al. |
| 7,782,417 | B2 | 8/2010 | Ma et al. |
| 10,330,979 | B2 | 6/2019 | Ryu et al. |
| 2020/0413559 | A1* | 12/2020 | Lee .................. H05K 1/189 |

FOREIGN PATENT DOCUMENTS

| JP | 2000-47209 A | 2/2000 |
| KR | 10-0640083 B1 | 10/2006 |
| KR | 10-2017-0064111 A | 6/2017 |
| KR | 10-2018-0077835 A | 7/2018 |
| KR | 10-2009663 B1 | 10/2019 |
| KR | 10-2047225 B1 | 11/2019 |
| KR | 20-0490966 Y1 | 1/2020 |

* cited by examiner

*Primary Examiner* — Anne M Hines
*Assistant Examiner* — Jose M Diaz
(74) *Attorney, Agent, or Firm* — Lewis Roca Rothgerber Christie LLP

(57) ABSTRACT

A method of manufacturing a display device includes providing a display layer including a light-emitting element, providing a base resin on the display layer, providing a chassis part by using a chassis providing unit including an electromagnet, providing a resin part by transforming a shape of the base resin, and separating the chassis providing unit from the display layer.

20 Claims, 15 Drawing Sheets

METHOD OF MANUFACTURING DISPLAY DEVICE AND DISPLAY DEVICE MANUFACTURED USING THE SAME

CROSS-REFERENCE TO RELATED APPLICATION

This application claims priority to and the benefit of Korean Patent Application No. 10-2021-0160428, filed in the Korean Intellectual Property Office on Nov. 19, 2021, the entire content of which is incorporated herein by reference.

BACKGROUND

1. Field

Aspects of embodiments of the present disclosure relate to a method of manufacturing a display device and a display device manufactured using the same.

2. Description of the Related Art

Because of the recent increase of interest in information display, research and development of display devices has been continuously being conducted.

SUMMARY

The present disclosure is directed to a method of manufacturing a display device exhibiting improved process efficiency and closely controlling positions of individual components, and a display device manufactured using the method.

The present disclosure is also directed to a method of manufacturing a display device in which a chassis part is applicable to a structure in which a substrate is not provided outside a display surface, and a display device manufactured using the method.

It should be noted that aspects and features of the present disclosure are not limited to those mentioned above, and other unmentioned aspects and features of the present disclosure will be clearly understood by those skilled in the art from the following descriptions.

According to an embodiment of the present disclosure, a method of manufacturing a display device includes: providing a display layer including a light-emitting element; providing a base resin on the display layer; providing a chassis part using a chassis providing unit including an electromagnet; providing a resin part by transforming a shape of the base resin; and separating the chassis providing unit from the display layer.

The electromagnet may be configured to have a first state having magnetism and a second state having no magnetism. The electromagnet may be in the first state during the providing of the chassis part, and the electromagnet may be in the second state during the separating of the chassis providing unit from the display layer.

The method may further include curing the resin part. In the curing of the resin part, the electromagnet may be in the first state such that a position of the chassis part is fixed.

The providing of the resin part may include bringing the chassis part and the base resin into contact with each other.

The bringing of the chassis part and the base resin into contact with each other may include changing a magnetic intensity of the electromagnet.

The method may further include providing a chip-on-film and a flexible circuit board on the display layer. A portion of the chip-on-film may be connected to the display layer, and another portion of the chip-on-film may be connected to the flexible circuit board. The providing of the base resin may include allowing the base resin and the chip-on-film to overlap each other when viewed in a plan view.

The display layer may have a first area and a second area other than the first area, and when viewed in a plan view, the display layer may overlap the chip-on-film, the resin part, and the chassis part in the first area and may not overlap the chip-on-film, the resin part, and the chassis part in the second area.

The chassis part may have a plate shape without a bending area.

The chassis part may include at least one selected from aluminum and magnesium.

The chassis part may have a thickness of 100 μm or less.

An overcoat layer and an outer film layer may be on the display layer, and the resin part may not overlap the outer film layer when viewed in a plan view.

One surface of the chassis part and one surface of the resin part may be formed to be complementary to each other.

The chassis providing unit may further include a guide jig having a portion extending in one direction and another portion extending in another direction.

The guide jig may be configured to restrict movement of the chassis part in the one direction.

According to an embodiment of the present disclosure, a method of manufacturing a display device includes: providing a display layer including a light-emitting element; accommodating a chassis part in a chassis providing unit, the chassis providing unit including a guide jig and an electromagnet; providing a base resin on the chassis part; moving the display layer in a gravitational direction to be adjacent to the base resin and transforming a shape of the base resin to provide a resin part; and separating the display layer from the chassis providing unit.

The method may further include providing an overcoat layer and an outer film layer on the display layer, and when the display layer is moved in the gravitational direction, the overcoat layer and the outer film layer may be closer to the chassis providing portion than the display layer.

The method may further include providing a chip-on-film and a flexible circuit board on the display layer, and before the providing of the resin part, the base resin and the chip-on-film may be spaced apart from each other.

The method may further include, before the separating of the display layer from the chassis providing unit, temporarily attaching the chip-on-film onto a rear surface of the display layer.

A display device may be manufactured according to the above-described method.

According to an embodiment of the present disclosure, a display device having a plurality of sides includes: a display layer on a substrate, the substrate having a first area and a second area, the display layer including a light-emitting element; an outer film layer on the display layer; a flexible circuit board configured to output an electrical signal to the display layer; a chip-on-film having one end connected to the first area and another end connected to the flexible circuit board; a resin part overlapping the chip-on-film in the first area and at least partially overlapping the outer film layer; and a chassis part overlapping the resin part in the first area. The chassis part includes metal, is adjacent to one of the plurality of sides of the display device, has a plate shape, and does not have a bending area.

Embodiments of the present disclosure are not be limited to those described above, and other embodiments, aspects, and features, which are not described herein, should be clearly understood by those skilled in the art to which the present disclosure belongs from the present specification and the accompanying drawings.

DETAILED DESCRIPTION

Figure 1:
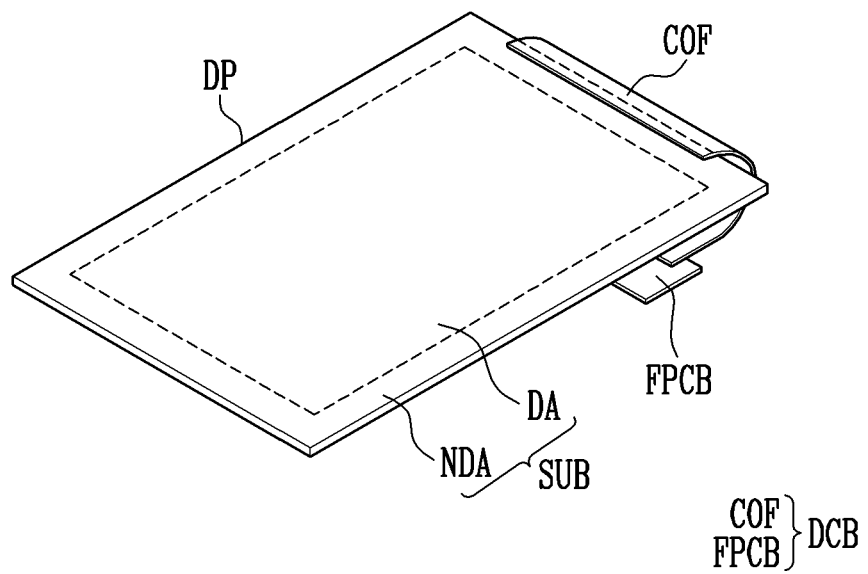
FIG. 1 is a schematic perspective view of a display device according to an embodiment.

Embodiments are described in this specification to clearly explain the scope of the present disclosure to those having ordinary skill in the art and are not intended to limit the present disclosure. It should be understood that the present disclosure may include substitutions and modifications within the technical scope of the present disclosure.

The terms used in this specification are selected from general terms, which are currently widely used, based on functions of components according to embodiments of the present disclosure, and may have meanings varying according to the intentions of those skilled in the art, the custom in the field of art, or advent of new technology. If a specific term is used with a specific meaning, the meaning of the term will be described specifically. Accordingly, the terms used in this specification should not be defined as simple names of the components but should be defined based on the actual meaning of the terms and the whole context throughout the present specification.

In the present specification, the accompanying drawings facilitate the description of the present disclosure, and the shape in the drawings may be exaggerated for the purpose of convenience of description such that the present disclosure should not be limited to the drawings.

In addition, the details of the generally known function and structure, which may obscure the subject matter of the present disclosure, may be omitted.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

The present disclosure relates to a method of manufacturing a display device and a display device manufactured using the same.

Hereinafter, the method of manufacturing a display device and the display device manufactured using the same will be described with reference to the accompanying drawings.

Before a method of manufacturing a display device DD according to an embodiment is described, the display device DD according to an embodiment will be described with reference to FIGS. 1 to 6.

Figure 2:
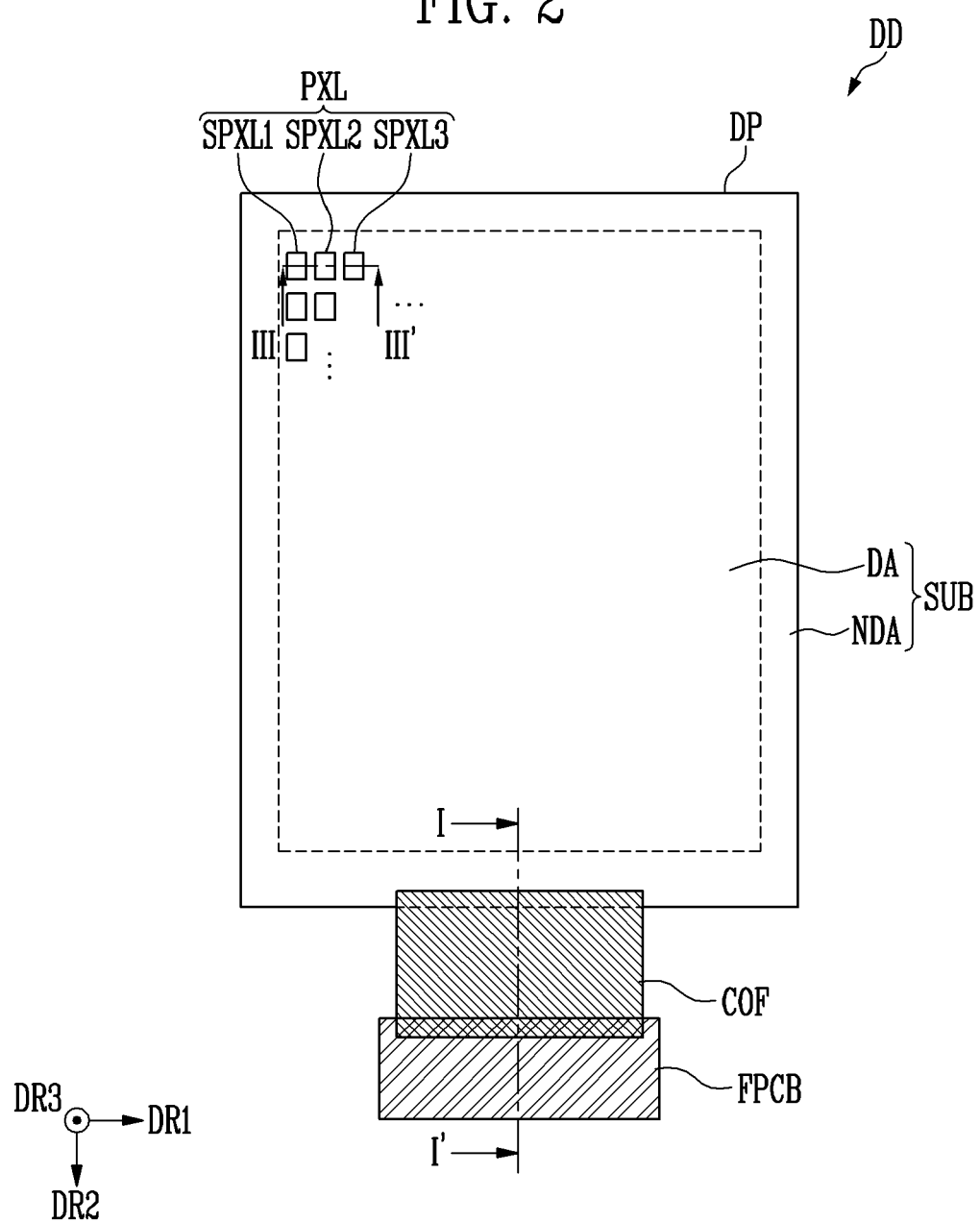
FIG. 2 is a schematic plan view of the display device shown in FIG. 1.

FIG. 1 is a schematic perspective view of a display device according to an embodiment, and FIG. 2 is a schematic plan view of the display device shown in FIG. 1.

Referring to FIGS. 1 and 2, the display device DD is configured to provide (or emit) light. The display device DD may include pixels PXL configured to provide (or emit) light.

The display device DD may include a display panel DP and a driving circuit board DCB.

The display panel DP may include a substrate SUB, a pixel PXL, a driver, and a line part (or line area). The driver may include a scan driver, an emission driver, and a data driver.

The substrate SUB may form (or constitute) a base surface of the display device DD. The substrate SUB may include a rigid material or a flexible material according to the intended use of the display device DD. The substrate SUB may include a flexible or rigid substrate or film. However, the material of the substrate SUB applied to embodiments of the present disclosure is not limited to a specific example.

The substrate SUB may have a display area DA and a non-display area NDA. Light may be provided in (or emitted from) the display area DA. In the display area DA, light may be emitted in a display direction of the display device DD (e.g., a third direction DR3 in FIG. 2). Light may not be provided in (or emitted from) the non-display area NDA.

The pixel PXL may be disposed on the substrate SUB and may include light-emitting elements LD (see, e.g., FIG. 4) to emit light. The pixel PXL may be disposed in the display area DA of the substrate SUB. The display area DA may be an area in which the pixel PXL is provided, and the non-display area NDA may be an area in which the pixel PXL is not provided.

According to embodiments, the pixels PXL may be arranged in a matrix form along rows extending in a first direction DR1 and columns extending in a second direction DR2. For example, the pixels PXL may be arranged according to a stripe or PenTile® (a registered trademark of Samsung Display Co., Ltd.) arrangement structure. However, the arrangement structure of the pixels PXL is not limited thereto, and the pixels PXL may be arranged in the display area DA in various structures and/or manners.

The pixel PXL may include a plurality of subpixels. For example, the pixel PXL may include a first subpixel SPXL1, a second subpixel SPXL2, and a third subpixel SPXL3. At least one of the first subpixel SPXL1, the second subpixel SPXL2, and the third subpixel SPXL3 may form (or constitute) one pixel unit capable of emitting light having various colors.

For example, each of the first subpixel SPXL1, the second subpixel SPXL2, and the third subpixel SPXL3 may emit light having a color (e.g., a predetermined color). As an example, the first subpixel SPXL1 may be a red pixel that emits light having a red color (e.g., a first color), the second subpixel SPXL2 may be a green pixel that emits light having a green color (e.g., a second color), and the third subpixel SPXL3 may be a blue pixel that emits light having a blue color (e.g., a third color).

However, the color, type, and/or number of the first subpixel SPXL1, the second subpixel SPXL2, and the third subpixel SPXL3 forming (or constituting) each pixel unit are not limited to a specific example.

The driver may be disposed in the non-display area NDA when viewed in a plan view. One of the scan driver, the emission driver, and the data driver may be disposed in the non-display area NDA together with the line part. According to embodiments, the driver may be disposed on the display panel DP and may be mounted on the driving circuit board DCB. The position of the driver is not necessarily limited to a specific example.

The driver may provide (or output) electrical information (or signals) to the pixel PXL. When electrical information is provided to the pixel PXL, the light-emitting element LD included in the pixel PXL may emit light.

The scan driver may transmit a scan signal to the pixel PXL along a scan line. The emission driver may provide an emission control signal to the pixel PXL along an emission control line. The data driver may provide a data signal to the pixel PXL along the data line.

The line part may be disposed in the non-display area NDA when viewed in a plan view. The line unit may electrically connect the driver and the pixel PXL.

The driving circuit board DCB may include a chip-on-film COF and a flexible circuit board FPCB.

The chip-on-film COF may provide an electrical signal based on a signal applied from the flexible circuit board FPCB to the display panel DP (e.g., to a display layer DL of the display panel DP).

One end of the chip-on-film COF may be connected (or attached) to the display panel DP, and the other end of the chip-on-film COF may be connected (or attached) to the flexible circuit board FPCB. At least a portion of the chip-on-film COF may be bendable.

The chip-on-film COF may include an insulating film and a plurality of lines provided on the insulating film. Chip-on-film COF may be a generic term for components including an insulating film formed of a thin film and lines formed on the insulating film and may be referred to as a tape carrier package (TCP), a flexible printed circuit board (FPCB), or the like. In the chip-on-film COF, a semiconductor chip connected to at least some of the lines may be further mounted on the insulating film.

A circuit element configured to process an electrical signal to be (e.g., that may be) applied to the display panel DP may be disposed on the flexible circuit board FPCB.

The flexible circuit board FPCB may be disposed on one surface (e.g., a rear surface) of the display panel DP. One end of the flexible circuit board FPCB may be connected to the chip-on-film COF, which has a bent shape to be disposed on the rear surface of the display panel DP, and, thus, may not be viewed from the outside of the flexible circuit board FPCB.

Figure 3:
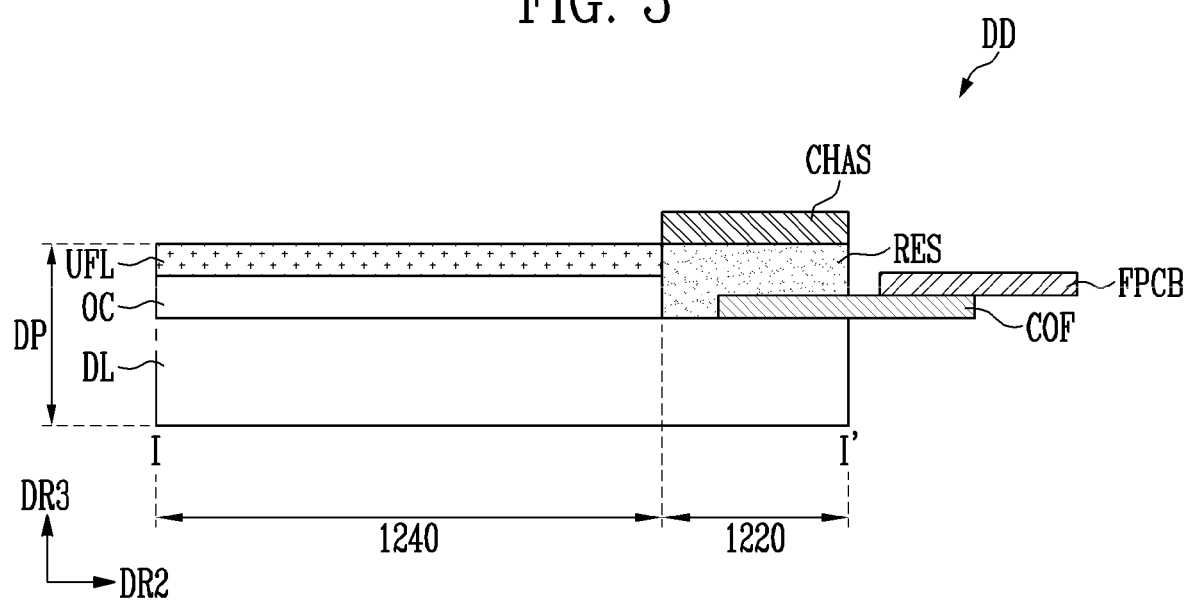
FIG. 3 is a schematic cross-sectional view taken along the line I-I' of FIG. 2.

FIG. 3 is a schematic cross-sectional view taken along the line I-I' of FIG. 2.

Referring to FIG. 3, a display device DD may include the display layer DL, an overcoat layer OC, an outer film layer UFL, the chip-on-film COF, the flexible circuit board FPCB, a resin part RES, and a chassis part CHAS.

The display layer DL may be a layer disposed at one side of the display panel DP and emits light.

For example, the display panel DP including the display layer DL may be implemented as a self-emission type display panel, such as an organic light-emitting display panel. However, when the display panel DP is implemented as a self-emission type, the pixels are not limited to an organic light-emitting element. For example, a light-emitting element of each pixel may be provided as an organic light-emitting diode, an inorganic light-emitting diode, or a quantum dot/well light-emitting diode. A plurality of light-emitting elements may be provided in each pixel. In such an embodiment, the plurality of light-emitting elements may be connected in series, parallel, series-parallel, or the like. In some embodiments, the display panel DP may be implemented as a non-emission type display panel, such as a liquid crystal display panel. When the display panel DP is implemented as a non-emission type, the display device DD may additionally include a light source, such as a backlight unit. Hereinafter, for convenience of description, descriptions will be provided based on an embodiment in which the display panel DP includes a quantum dot/well light-emitting element.

According to embodiments, the display layer DL may include a first area 1220 and a second area 1240. The second area 1240 may be an area other than the first area 1220.

The flexible circuit board FPCB may be connected to (or attached to) the display panel DP (or the display layer DL) through the chip-on-film COF. For example, a portion of the chip-on-film COF may be bent so that the flexible circuit board FPCB is provided to be disposed on a rear surface of the display layer DL.

According to embodiments, a portion of the chip-on-film COF may be disposed (or connected) to the display layer DL in the first area 1220. The first area 1220 may be an area in which the resin part RES is disposed. The first area 1220 may be an area in which the chassis part CHAS is disposed. When viewed in a plan view, the resin part RES, the chassis part CHAS, and the chip-on-film COF may overlap in the first area 1220.

The overcoat layer OC may be disposed on the display layer DL. The overcoat layer OC may offset (or planarize) a step difference according to individual components disposed on the display layer DL. According to embodiments, the overcoat layer OC may overlap the second area 1240.

The outer film layer UFL may be disposed on the overcoat layer OC. The outer film layer UFL may be disposed on an outer surface (or a layer adjacent to the outer surface) of the display panel DP to protect individual components of the display panel DP. According to embodiments, the outer film layer UFL may not overlap (e.g., may be offset from) the first area 1220 when viewed in a plan view. The outer film layer UFL may overlap the second area 1240.

The display layer DL, the overcoat layer OC, and the outer film layer UFL will be described below with reference to FIGS. 4 to 6.

The resin part RES may be disposed in the first area 1220. The resin part RES may cover a portion of the chip-on-film COF disposed on the display layer DL. The resin part RES may not be disposed in the second area 1240.

According to embodiments, the resin part RES may not overlap the outer film layer UFL when viewed in a plan view because, for example, a process of forming the resin part RES is closely controlled by a display device manufacturing apparatus. This will be described below, in more detail, with reference to FIGS. 8 and 9.

The resin part RES may include (e.g., may be a member including) a resin. For example, the resin part RES may include a general organic compound. The resin part RES may include a polymer or a suitable known resin for forming a film, but the present disclosure is not necessarily limited to a specific example.

The resin part RES may contact the chassis part CHAS. One surface of the resin part RES may physically (or directly) contact one surface of the chassis part CHAS so that one surface of the resin part RES may be formed to be complementary to one surface (e.g., to a corresponding surface) of the chassis part CHAS. The resin part RES may bond the chassis part CHAS.

The resin part RES may be formed at one side of the display device DD. For example, the resin part RES may be disposed at one side of the display device DD on which the chip-on-film COF and the flexible circuit board FPCB are disposed and may reduce influences of dust and moisture on the display device DD. At least a portion of the resin part RES may not overlap the outer film layer UFL. The chassis part CHAS may be disposed in the first area 1220. When viewed in a plan view, the chassis part CHAS may overlap the chip-on-film COF and the resin part RES in the first area 1220. The chassis part CHAS may be disposed on the resin part RES. According to embodiments, the chassis part CHAS may define (or cover) an upper surface of the resin part RES. Accordingly, one surface of the chassis part CHAS and one surface of the resin part RES may contact each other and may have surface shapes that correspond to each other.

According to embodiments, the display device DD may include a plurality of sides, and the chassis part CHAS may be disposed adjacent to one of the plurality of sides. For example, the chassis part CHAS may be disposed adjacent to a side at which the driving circuit board DCB is disposed.

According to embodiments, the chassis part CHAS may include a metal material. For example, the chassis part CHAS may include an alloy including aluminum (Al) and magnesium (Mg). The chassis part CHAS may be disposed at one side of the display device DD to prevent components adjacent to an outer surface of the display device DD from being observed from the outside, thereby improving the aesthetics of the display device DD.

According to embodiments, the chassis part CHAS may have a shape extending (or primarily extending) in one direction. For example, the chassis part CHAS may have a flat plate shape that does not have a bending area.

According to embodiments, the chassis part CHAS may have a thickness of about 100 µm or less. In some embodiments, the chassis part CHAS may have a thickness of 80 µm or less. According to the present disclosure, an electromagnet 240 (see, e.g., FIG. 9) may be used to closely control the arrangement of the chassis part CHAS, and thus, even when the chassis part CHAS is relatively thin, sufficient process efficiency may be secured. For example, according to related art, the chassis part CHAS has a bent shape, and the chassis part CHAS may be disposed in such a manner that a portion of the chassis part CHAS is placed on an adjacent thick layer (e.g., an upper substrate). Accordingly, in the related art, the chassis part CHAS must have a minimum thickness. However, according to embodiments of the present disclosure, because the chassis part CHAS is disposed by using the electromagnet 240, the chassis part CHAS may have a sufficiently thin thickness, thereby improving process efficiency, reducing process costs, and reducing the weight of the display device DD.

In FIG. 3, a spacing distance (e.g., a vertical distance) between the chassis part CHAS and the display layer DL is illustrated as being greater than a spacing distance between the outer film layer UFL and the display layer DL, but the present disclosure is not limited thereto. According to embodiments, the spacing distance between the chassis part CHAS and the display layer DL may be less than or equal to the spacing distance between the outer film layer UFL and the display layer DL.

Hereinafter, a detailed structure of the display layer DL according to an embodiment will be described with reference to FIGS. 4 to 6. Contents overlapping above-described contents may be simplified or omitted.

Figure 4:
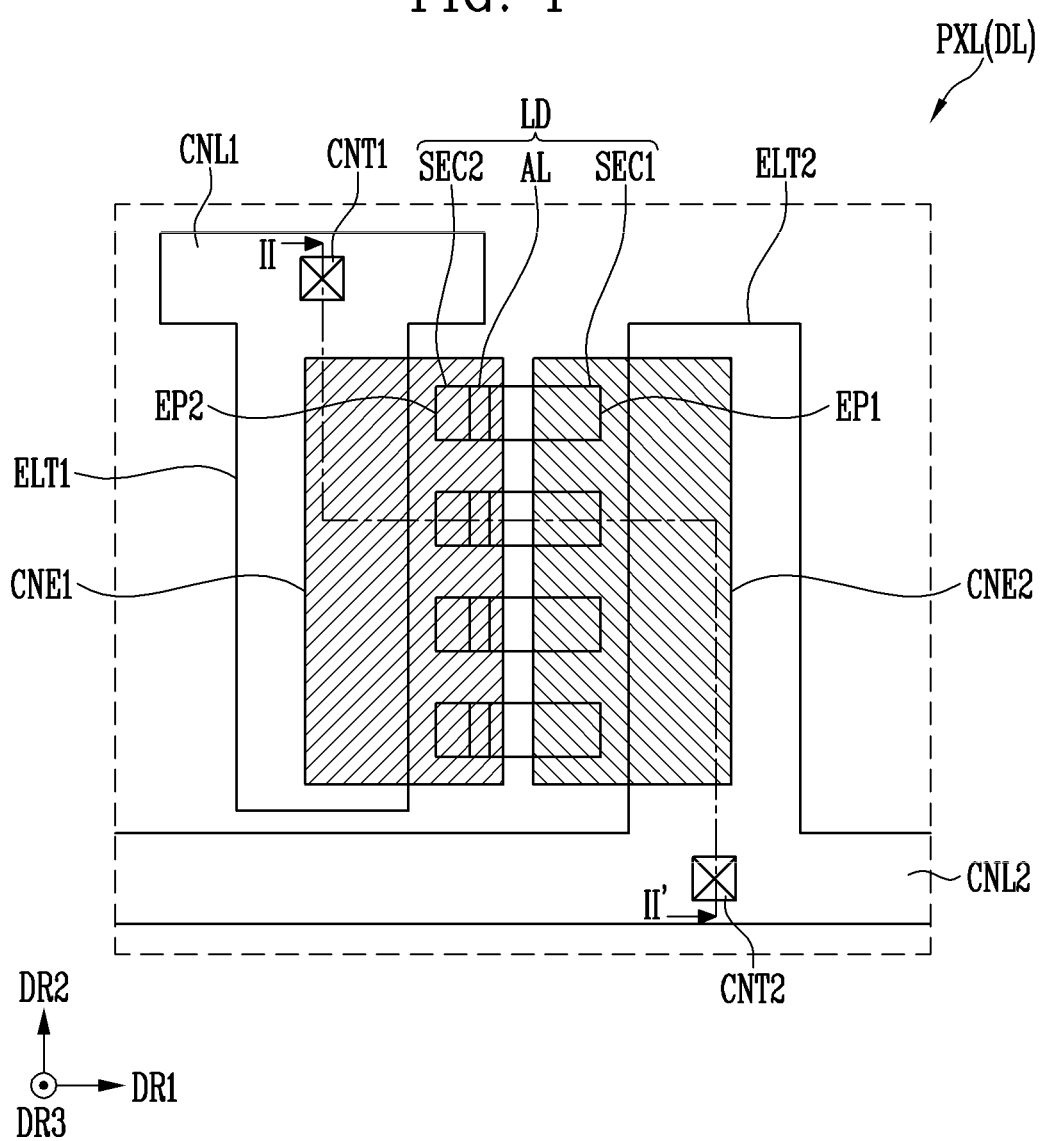
FIG. 4 is a schematic plan view of a pixel according to an embodiment.

FIG. 4 is a schematic plan view of a pixel according to an embodiment. FIG. 4 illustrates a pixel PXL included in a display layer DL according to an embodiment.

Referring to FIG. 4, the pixel PXL may include a first electrode ELT1, a second electrode ELT2, a first connection electrode CNL1, a second connection electrode CNL2, a first contact portion CNT1, a second contact portion CNT2, light-emitting elements LD, a first contact electrode CNE1, and a second contact electrode CNE2.

The light-emitting element LD may include a first semiconductor layer SEC1, a second semiconductor layer SEC2, and an active layer AL interposed between the first semiconductor layer SEC1 and the second semiconductor layer SEC2.

The light-emitting element LD may have a first end portion EP1 and a second end portion EP2. The first semiconductor layer SEC1 may be adjacent to the first end portion EP1 of the light-emitting element LD, and the second semiconductor layer SEC2 may be adjacent to the second end portion EP2 of the light-emitting element LD.

According to embodiments, the light-emitting element LD may have a pillar shape. The pillar shape may refer to a shape extending in a length direction of the light-emitting element LD, such as a cylindrical shape or a polygonal pillar shape. For example, a length of the light-emitting element LD may be greater than a diameter (or a width of a cross section) thereof. A cross-sectional shape of the light-emitting element LD may be square or circular but is not limited thereto.

The light-emitting element LD may have a size ranging from a nanometer scale to a micrometer scale.

The first semiconductor layer SEC1 may be a first-conductivity type semiconductor layer. For example, the first semiconductor layer SEC1 may include an N-type semiconductor layer. As an example, the first semiconductor layer SEC1 may include an N-type semiconductor layer, which includes any one semiconductor material selected from InAlGaN, GaN, AlGaN, InGaN, AlN, and InN and is doped with a first-conductivity type dopant, such as silicon (Si), germanium (Ge), tin (Sn), or the like. However, a material constituting the first semiconductor layer SEC1 is not limited thereto, and the first semiconductor layer SEC1 may be formed (or made) of various suitable materials.

The active layer AL may be disposed on the first semiconductor layer SEC1. The active layer AL may be disposed between the first semiconductor layer SEC1 and the second semiconductor layer SEC2.

The active layer AL may include at least one selected from AlGaInP, AlGaP, AlInGaN, InGaN, and AlGaN. For example, when the active layer AL is to output red light, the active layer AL may include AlGaInP and/or InGaN. When the active layer AL is to output green light or blue light, the active layer AL may include InGaN. However, the present disclosure is not limited to the above-described examples.

The active layer AL may be formed to have a single-quantum well or multi-quantum well structure.

The second semiconductor layer SEC2 may be disposed on the active layer AL and may include a semiconductor layer that has a different type from the first semiconductor layer SEC1. For example, the second semiconductor layer SEC2 may include a P-type semiconductor layer. As an example, the second semiconductor layer SEC2 may include a P-type semiconductor layer, which includes any one semiconductor material selected from InAlGaN, GaN, AlGaN, InGaN, AlN, and InN and is doped with a second-conductivity type dopant, such as magnesium (Mg). However, a material constituting the second semiconductor layer SEC2 is not limited thereto, and the second semiconductor layer SEC2 may be formed (or made) of various suitable materials.

When a voltage greater than or equal to a threshold voltage is applied to both end portions of the light-emitting element LD, electrons and holes are combined to form electron-hole pairs in the active layer AL so that the light-emitting elements LD emits light.

According to embodiments, the light-emitting element LD may further include an element insulating film provided on a surface thereof. The element insulating film may be formed as a single film or a plurality of films. The element insulating film may expose both end portions of the light-emitting element LD, which have different polarities.

According to embodiments, the element insulating film may include at least one insulating material selected from silicon oxide ($SiO_x$), silicon nitride ($SiN_x$), silicon oxynitride ($SiO_xN_y$), aluminum oxide ($AlO_x$), and titanium oxide ($TiO_x$). However, the present disclosure is not limited to a specific example.

According to embodiments, the light-emitting element LD may further include additional components other than the first semiconductor layer SEC1, the active layer AL, and the second semiconductor layer SEC2. For example, the light-emitting element LD may further include a phosphor layer, another active layer, another semiconductor layer, and/or an electrode layer.

The plurality of light-emitting elements LD may be provided and arranged. As an example, the light-emitting elements LD may be arranged in parallel in a second direction DR2. However, the arrangement structure of the light-emitting elements LD is not limited thereto.

The light-emitting element LD may be disposed between electrodes that act as alignment electrodes. For example, the light-emitting element LD may be disposed between the first electrode ELT1 and the second electrode ELT2. For example, the light-emitting element LD may be disposed on the first electrode ELT1 and the second electrode ELT2. At least a portion of the light-emitting element LD may be disposed between the first electrode ELT1 and the second electrode ELT2 when viewed in a plan view.

The light-emitting element LD may be electrically connected to the first electrode ELT1 through the first contact electrode CNE1.

According to embodiments, the second end EP2 of the light-emitting element LD may be electrically connected to the first contact electrode CNE1. Accordingly, the second semiconductor layer SEC2 of the light-emitting element LD may be electrically connected to the first electrode ELT1 and the first contact electrode CNE1.

The light-emitting element LD may be electrically connected to the second electrode ELT2 through the second contact electrode CNE2.

According to embodiments, the first end portion EP1 of the light-emitting element LD may be electrically connected to the second contact electrode CNE2. Accordingly, the first semiconductor layer SEC1 of the light-emitting element LD may be electrically connected to the second electrode ELT2 and the second contact electrode CNE2.

The first electrode ELT1 may extend in the second direction DR2. The first electrode ELT1 may be spaced apart from the second electrode ELT2 in a first direction DR1. The first electrode ELT1 may be connected to the first connection electrode CNL1. The first direction DR1 may be different from the second direction DR2.

Figure 5:
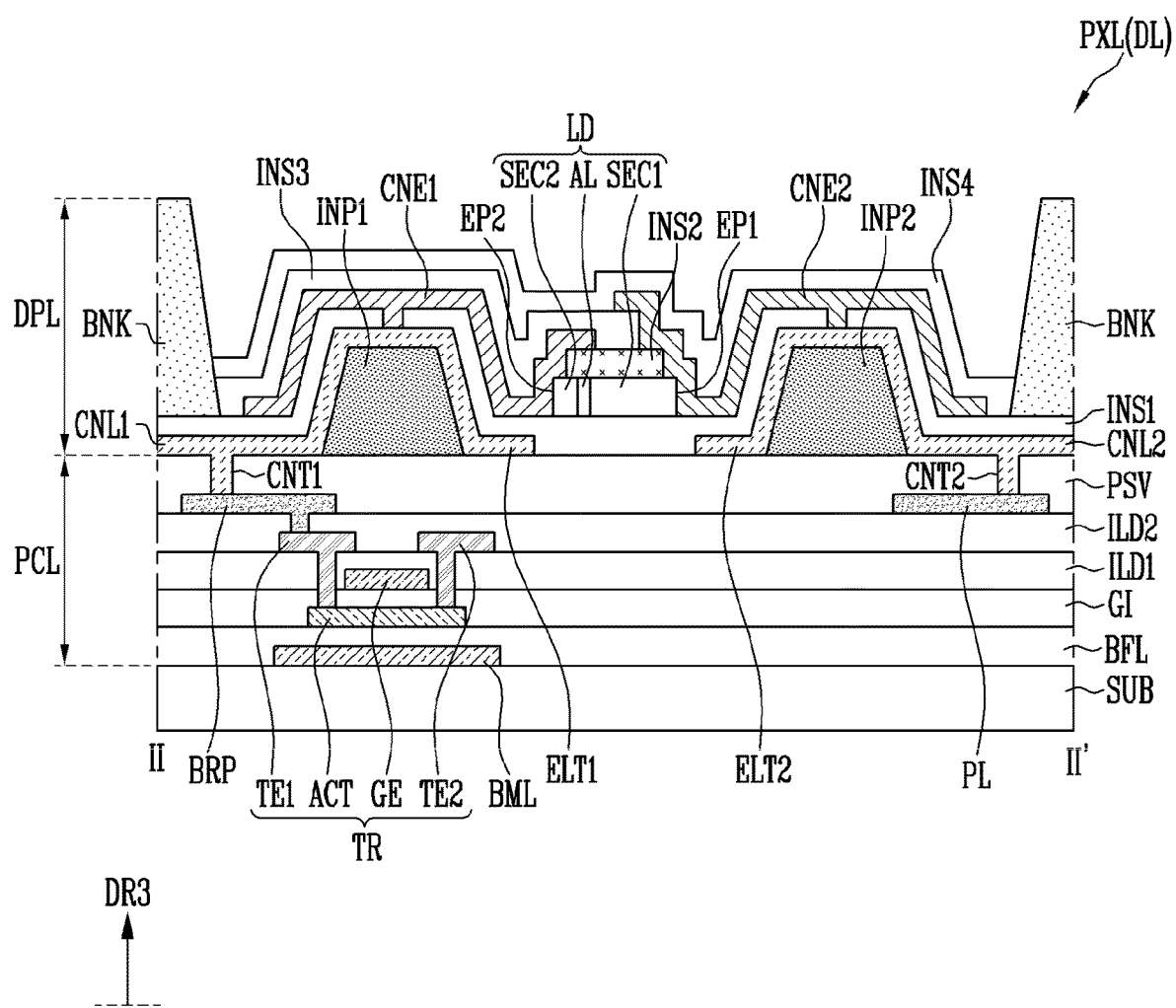
FIG. 5 is a schematic cross-sectional view taken along the line II-II' of FIG. 4.

The first connection electrode CNL1 may be connected to a bridge pattern BRP included in a pixel circuit layer PCL through the first contact portion CNT1 (see, e.g., FIG. 5). The first connection electrode CNL1 and the first electrode ELT1 may be disposed to be coplanar with each other and may be integrally formed with each other.

The second electrode ELT2 may extend in the second direction DR2. The second electrode ELT2 may be spaced apart from the first electrode ELT1 in the first direction DR1. The second electrode ELT2 may be connected to the second connection electrode CNL2.

The second connection electrode CNL2 may be connected to a power line PL included in the pixel circuit layer PCL through the second contact portion CNT2 (see, e.g., FIG. 5). The second connection electrode CNL2 and the second electrode ELT2 may be disposed to be coplanar with each other and may be integrally formed with each other.

The first contact electrode CNE1 may be disposed on the first electrode ELT1 and electrically connected to the first electrode ELT1. The first contact electrode CNE1 may electrically connect the first electrode ELT1 and the light-emitting element LD.

The second contact electrode CNE2 may be disposed on the second electrode ELT2 and electrically connected to the second electrode ELT2. The second contact electrode CNE2 may electrically connect the second electrode ELT2 and the light-emitting element LD.

Hereinafter, a cross-sectional structure of the pixel PXL according to an embodiment will be primarily described with reference to FIGS. 5 and 6. FIG. 5 is a view illustrating the display layer DL taken along the line II-II' in FIG. 4 and schematically illustrates a cross section of the pixel PXL shown in FIG. 4. FIG. 6 is a view illustrating the display panel DP including a display layer DL taken along the line III-III' in FIG. 2 and schematically illustrates a cross section of the pixel PXL.

Referring to FIG. 5, the display layer DL (or the pixel PXL) may include a substrate SUB, a pixel circuit layer PCL, and a display element layer DPL.

The substrate SUB may constitute a base member of a display device DD. The substrate SUB may be a rigid or flexible substrate or film but is not limited to a specific example. The substrate SUB may be provided as a base surface, and the pixel circuit layer PCL and the display element layer DPL may be disposed on the substrate SUB.

The pixel circuit layer PCL is disposed on the substrate SUB. The pixel circuit layer PCL may include a lower electrode layer BML, a buffer film BFL, a transistor TR, a gate insulating film GI, a first interlayer insulating film ILD1, a second interlayer insulating film ILD2, a bridge pattern BRP, a power line PL, a protective film PSV, a first contact portion CNT1, and a second contact portion CNT2.

The lower electrode layer BML may be disposed on the substrate SUB and may be covered by the buffer film BFL. A portion of the lower electrode layer BML may overlap the transistor TR when viewed in a plan view.

According to embodiments, the lower electrode layer BML may include a conductive material and may be a path through which an electrical signal provided to the pixel circuit layer PCL and the display element layer DPL moves (or is transmitted). As an example, the lower electrode layer BML may include at least one selected from aluminum (Al), copper (Cu), titanium (Ti), and molybdenum (Mo).

The buffer film BFL may be disposed on the substrate SUB. The buffer film BFL may prevent impurities from being diffused from the outside. The buffer film BFL may include at least one metal oxide, such as silicon nitride ($SiN_x$), silicon oxide ($SiO_x$), silicon oxynitride ($SiO_xN_y$), and aluminum oxide ($AlO_x$).

The transistor TR may be a thin film transistor. According to one embodiment, the transistor TR may be a driving transistor.

The transistor TR may be electrically connected to a light-emitting element LD. The transistor TR may be electrically connected to the bridge pattern BRP. However, the present disclosure is not limited to the above-described example. According to an example, the transistor TR may be electrically connected (e.g., directly electrically connected) to a first connection electrode CNL1 without passing through the bridge pattern BRP.

The transistor TR may include an active layer ACT, a first transistor electrode TE1, a second transistor electrode TE2, and a gate electrode GE.

The active layer ACT may be a semiconductor layer. The active layer ACT may be disposed on the buffer film BFL. According to an example, the active layer ACT may include at least one selected from low temperature polycrystalline silicon (LTPS), polysilicon, amorphous silicon, and an oxide semiconductor.

The active layer ACT may have a first contact region contacting the first transistor electrode TE1 and a second contact region contacting the second transistor electrode TE2. The first contact region and the second contact region may be semiconductor patterns doped with impurities. A region between the first contact region and the second contact region may be a channel region. The channel region may be an intrinsic semiconductor pattern that is not doped with impurities.

The gate electrode GE may be disposed on the gate insulating film GI. A position of the gate electrode GE may correspond to a position of the channel region of the active layer ACT. For example, the gate electrode GE may be disposed on the channel region of the active layer ACT with the gate insulating film GI interposed therebetween. According to an example, the gate electrode GE may include at least one selected from aluminum (Al), copper (Cu), titanium (Ti), and molybdenum (Mo).

The gate insulating film GI may be disposed on the active layer ACT. The gate insulating film GI may include an inorganic material. According to an example, the gate insulating film GI may include at least one selected from silicon nitride ($SiN_x$), silicon oxide ($SiO_x$), silicon oxynitride ($SiO_xN_y$), and aluminum oxide ($AlO_x$).

The first interlayer insulating film ILD1 may be on the gate electrode GE. Similar to the gate insulating film GL, the first interlayer insulating film ILD1 may include at least one selected from silicon nitride ($SiN_x$), silicon oxide ($SiO_x$), silicon oxynitride ($SiO_xN_y$), and aluminum oxide ($AlO_x$).

The first transistor electrode TE1 and the second transistor electrode TE2 may be disposed on the first interlayer insulating film ILD1. The first transistor electrode TE1 may pass through the gate insulating film GI and the first interlayer insulating film ILD1 and may contact the first contact region of the active layer ACT, and the second transistor electrode TE2 may pass through the gate insulating film GI and the first interlayer insulating film ILD1 and may contact the second contact region of the active layer ACT. According to an example, the first transistor electrode TE1 may be a drain electrode, and the second transistor electrode TE2 may be a source electrode, but the present disclosure is not limited thereto.

The second interlayer insulating film ILD2 may be positioned on the first transistor electrode TE1 and the second transistor electrode TE2. Similar to the first interlayer insulating film ILD1 and the gate insulating film GI, the second interlayer insulating film ILD2 may include an inorganic material. Examples of the inorganic material may include at least one selected from the materials described as the structural materials of the first interlayer insulating film ILD1 and the gate insulating film GL, for example, at least one selected from silicon nitride ($SiN_x$), silicon oxide ($SiO_x$), silicon oxynitride ($SiO_xN_y$), and aluminum oxide ($AlO_x$).

The bridge pattern BRP may be disposed on the second interlayer insulating film ILD2. The bridge pattern BRP may be connected to the first transistor electrode TE1 through a contact opening (e.g., a contact hole) passing through the second interlayer insulating film ILD2. The bridge pattern BRP may be electrically connected to the first connection electrode CNL1 through the first contact portion CNT1 formed in the protective layer PSV.

The power line PL may be disposed on the second interlayer insulating film ILD2. The power line PL may be electrically connected to a second connection electrode CNL2 through the second contact portion CNT2 formed in the protective layer PSV. The power line PL may provide power (e.g., a cathode signal) to the light-emitting element LD through a second electrode.

The protective film PSV may be positioned on the second interlayer insulating film ILD2. The protective film PSV may cover the bridge pattern BRP and the power line PL. The protective film PSV may be a via layer.

According to one embodiment, the protective layer PSV may include an organic insulating layer, an inorganic insulating layer, or an organic insulating layer disposed on an inorganic insulating layer, but the present disclosure is not limited thereto.

According to embodiments, the first contact portion CNT1 connected to one area of the bridge pattern BRP and the second contact portion CNT2 connected to one area of the power line PL may be formed in (or may extend through) the protective layer PSV.

The display element layer DPL may be disposed on the pixel circuit layer PCL. The display element layer DPL may include a first insulating pattern INP1, a second insulating pattern INP2, a bank BNK, the first connection electrode CNL1, the second connection electrode CNL2, the first electrode ELT1, the second electrode ELT2, a first insulating film INS1, the light-emitting elements LD, a second insulating film INS2, the first contact electrode CNE1, the second contact electrode CNE2, and a third insulating film INS3.

The first insulating pattern INP1 and the second insulating pattern INP2 may be disposed on the protective film PSV. The first insulating pattern INP1 and the second insulating pattern INP2 may have a shape that protrudes in a display direction of the display device DD (e.g., the third direction DR3 in FIG. 5). According to an example, the first insulating pattern INP1 and the second insulating pattern INP2 may include an organic material or an inorganic material, but the present disclosure is not limited thereto.

The bank BNK may be disposed on the protective film PSV. The bank BNK may have a shape that protrudes in the display direction of the display device DD (e.g., the third direction DR3 in FIG. 5). The bank BNK may define a space in which ink may be accommodated (or deposited) during an inkjet process of arranging the light-emitting element LD.

The first connection electrode CNL1 and the second connection electrode CNL2 may be disposed on the protective film PSV. The first connection electrode CNL1 may be connected to the first electrode ELT1. The first connection electrode CNL1 may be electrically connected to the bridge pattern BRP through the first contact portion CNT1. The first connection electrode CNL1 may electrically connect the bridge pattern BRP to the first electrode ELT1. The second connection electrode CNL2 may be connected to the second electrode ELT2. The second connection electrode CNL2 may be electrically connected to the power line PL through the second contact portion CNT2. The second connection electrode CNL2 may electrically connect the power line PL and the second electrode ELT2.

The first electrode ELT1 and the second electrode ELT2 may be disposed on the protective film PSV. According to embodiments, at least a portion of the first electrode ELT1 may be disposed on the first insulating pattern INP1 to act as a reflective partition wall, and at least a portion of the second electrode ELT2 may be disposed on the second insulating pattern INP2 to act as a reflective partition wall.

The first electrode ELT1 may be electrically connected to the light-emitting element LD. The first electrode ELT1 may be electrically connected to the first contact electrode CNE1 through a contact opening (e.g., a contact hole) formed in the first insulating film INS1. The first electrode ELT1 may provide an anode signal to the light-emitting element LD.

The second electrode ELT2 may be electrically connected to the light-emitting element LD. The second electrode ELT2 may be electrically connected to the second contact electrode CNE2 through a contact opening (e.g., a contact hole) formed in the first insulating film INS1. The second electrode ELT2 may apply a cathode signal (e.g., a ground signal) to the light-emitting element LD.

The first electrode ELT1 and the second electrode ELT2 may include a conductive material. As an example, the first electrode ELT1 and the second electrode ELT2 may include a metal, such as silver (Ag), magnesium (Mg), aluminum (Al), platinum (Pt), palladium (Pd), gold (Au), nickel (Ni), neodymium (Nd), iridium (Ir), chromium (Cr), titanium (Ti), or an alloy thereof. However, the present disclosure is not limited to the above-described example.

According to embodiments, the first electrode ELT1 and the second electrode ELT2 may act as alignment electrodes for the light-emitting element LD. For example, the light-emitting elements LD may be arranged based on electrical signals provided to the first electrode ELT1 and the second electrode ELT2.

The first insulating film INS1 may be disposed on the protective film PSV. The first insulating film INS1 may cover the first electrode ELT1 and the second electrode ELT2. The first insulating film INS1 may stabilize a connection between electrode components and may reduce external influences. The first insulating film INS1 may include at least one selected from silicon nitride ($SiN_x$), silicon oxide ($SiO_x$), silicon oxynitride ($SiO_xN_y$), and aluminum oxide ($AlO_x$).

The light-emitting element LD may be disposed on the first insulating film INS1 to emit light based on electrical signals provided from the first contact electrode CNE1 and the second contact electrode CNE2.

The second insulating film INS2 may be disposed on the light-emitting element LD. The second insulating film INS2 may cover the active layer AL of the light-emitting element LD. According to an example, the second insulating film INS2 may include at least one of an organic material and/or an inorganic material.

The first contact electrode CNE1 and the second contact electrode CNE2 may be disposed on the first insulating film INS1. The first contact electrode CNE1 may electrically connect the first electrode EL1 and the light-emitting elements LD, and the second contact electrode CNE2 may electrically connect the second electrode EL2 and the light-emitting element LD.

According to embodiments, the first contact electrode CNE1 may provide an anode signal to the light-emitting element LD, and the second contact electrode CNE2 may provide a cathode signal to the light-emitting element LD.

The first contact electrode CNE1 and the second contact electrode CNE2 may include a conductive material. According to an example, the first contact electrode CNE1 and the second contact electrode CNE2 include a transparent conductive material, including at least one selected from indium tin oxide (ITO), indium zinc oxide (IZO), and indium tin zinc oxide (ITZO), but the present disclosure is not limited thereto.

The third insulating film INS3 may be disposed on the first contact electrode CNE1. The third insulating layer INS3 may include at least one selected from the materials described above with reference to the first insulating film INS1. According to embodiments, a portion of the third insulating film INS3 is disposed between the first contact electrode CNE1 and the second contact electrode CNE2, thereby preventing the first contact electrode CNE1 and the second contact electrode CNE2 from electrically short-circuiting with each other.

The fourth insulating film INS4 may be disposed on the first contact electrode CNE1, the second contact electrode CNE2, and the third insulating film INS3. The fourth insulating film INS4 may protect individual components of the display element layer DPL. According to an example, the fourth insulating film INS4 may include at least one selected from silicon nitride ($SiN_x$), silicon oxide ($SiO_x$), silicon oxynitride ($SiO_xN_y$), and aluminum oxide ($AlO_x$).

Next, layers included in the pixel PXL according to the embodiment will be described with reference to FIG. 6. In FIG. 6, individual components of a pixel circuit layer PCL and a display element layer DPL are simplified for convenience of description.

Figure 6:
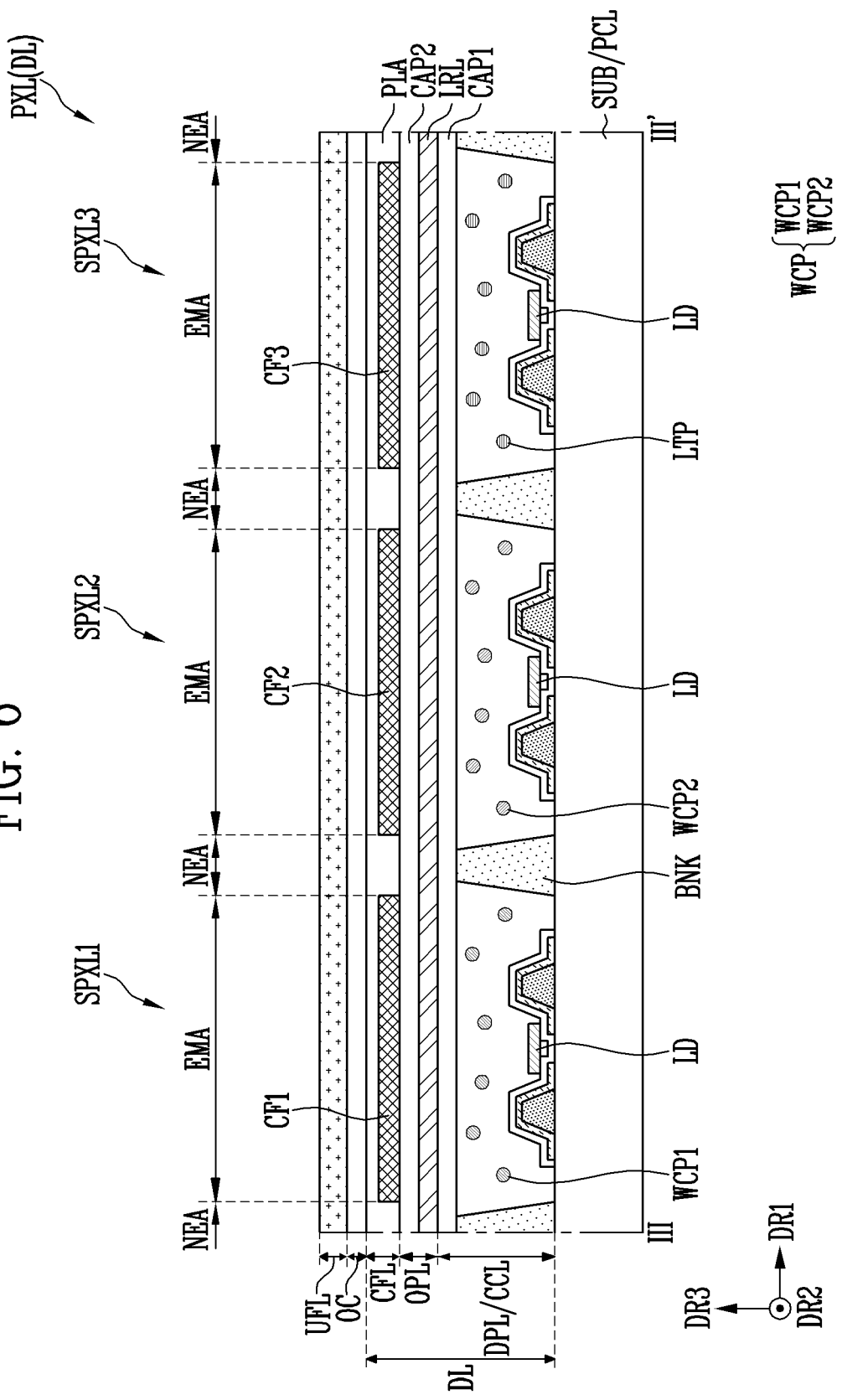
FIG. 6 is a schematic cross-sectional view taken along the line III-III' of FIG. 2.

Referring to FIG. 6, the display layer DL (or the pixel PXL) may further include a color conversion unit CCL, an optical layer OPL, and a color filter unit CFL. The display panel DP (or the pixel PXL) may further include an overcoat layer OC and the outer film layer UFL disposed on the display layer DL.

According to embodiments, light-emitting elements LD disposed in a first subpixel SPXL1, a second subpixel SPXL2, and a third subpixel SPXL3 may emit light having the same color. For example, the first subpixel SPXL1, the second subpixel SPXL2, and the third subpixel SPXL3 may include light-emitting elements LD that emit light having a third color, for example, light having a blue color. The color conversion unit CCL and/or the color filter unit CFL may be provided in the first subpixel SPXL1, the second subpixel SPXL2, and the third subpixel SPXL3 to display a full-color image. However, the present disclosure is not necessarily limited thereto, and the first subpixel SPXL1, the second subpixel SPXL2, and the third subpixel SPXL3 may include light-emitting elements LD that emit light having different colors.

According to embodiments, the color conversion unit CCL may be disposed to be coplanar with the display element layer DPL. For example, the color converter CCL may be disposed between banks BNK.

The color conversion unit CCL may include a wavelength conversion pattern WCP, a light transmission pattern LTP, and a first capping layer CAP1. According to an example, the wavelength conversion pattern WCP may include a first wavelength conversion pattern WCP1 and a second wavelength conversion pattern WCP2.

The first wavelength conversion pattern WCP1 may be disposed to overlap an emission area EMA of the first subpixel SPXL1. For example, the first wavelength conversion pattern WCP1 may be provided between the banks BNK and may overlap the emission area EMA of the first subpixel SPXL1 when viewed in a plan view.

The second wavelength conversion pattern WCP2 may be disposed to overlap an emission area EMA of the second subpixel SPXL2. For example, the second wavelength conversion pattern WCP2 may be provided between the banks BNK and may overlap the emission area EMA of the second subpixel SPXL2 when viewed in a plan view.

The light transmission pattern LTP may be disposed to overlap an emission area EMA of the third subpixel SPXL3. For example, the light transmission pattern LTP may be provided between the banks BNK and may overlap the emission area EMA of the third subpixel SPXL3 when viewed in a plan view.

According to embodiments, the first wavelength conversion pattern WCP1 may include first color conversion particles that convert light having the third color emitted from the light-emitting element LD into light having a first color. As an example, when the light-emitting element LD is a blue light-emitting element emitting light having a blue color and the first subpixel SPXL1 is a red pixel, the first wavelength conversion pattern WCP1 may include first quantum dots that convert light having a blue color emitted from the blue light-emitting element into light having a red color.

For example, the first wavelength conversion pattern WCP1 may include the plurality of first quantum dots dispersed in a matrix material, such as a base resin. The first quantum dot may absorb light having a blue color to shift a wavelength according to an energy transition and to emit light having a red color. When the first subpixel SPXL1 is a different color pixel, the first wavelength conversion pattern WCP1 may include first quantum dots corresponding to a color of the first subpixel SPXL1.

According to embodiments, the second wavelength conversion pattern WCP2 may include second color conversion particles that convert light having the third color emitted from the light-emitting element LD into light having a second color. As an example, when the light-emitting element LD is a blue light-emitting element emitting light having a blue color and the second subpixel SPXL2 is a green pixel, the second wavelength conversion pattern WCP2 may include second quantum dots that convert light having a blue color emitted from the blue light-emitting element into light having a green color.

For example, the second wavelength conversion pattern WCP2 may include the plurality of second quantum dots dispersed in a matrix material, such as a base resin. The second quantum dot may absorb light having a blue color to shift a wavelength according to an energy transition and to emit light having a green color. When the second subpixel SPXL2 is a different color pixel, the second wavelength conversion pattern WCP2 may include second quantum dots corresponding to a color of the second subpixel SPXL2.

The first quantum dots and the second quantum dots may have a shape of spherical, pyramidal, multi-arm, or cubic nanoparticles, nanotubes, nanowires, nanofibers, or nanoplate particles, but the present disclosure is not necessarily limited thereto. The shape of the first quantum dots and the second quantum dots may be variously changed.

In one embodiment, blue light having a relatively short wavelength in a visible light region is incident on the first quantum dots and the second quantum dots, thereby increasing an absorption coefficient of the first quantum dots and the second quantum dots. Accordingly, the efficiency of light emitted from the first subpixel SPXL1 and the second subpixel SPXL2 can be increased and excellent color reproducibility can be ensured. In addition, a pixel unit of the first to third subpixels SPXL1, SPXL2, and SPXL3 are formed using the same color light-emitting elements LD (e.g., blue light-emitting elements), thereby increasing the manufacturing efficiency of the display device.

According to embodiments, the light transmission pattern LTP may be provided to efficiently use light having the third color emitted from the light-emitting element LD. As an example, when the light-emitting element LD is a blue light-emitting element emitting light having a blue color and the third subpixel SPXL3 is a blue pixel, the light transmission pattern LTP may include at least one type of light scattering particles in order to efficiently use light emitted from the light-emitting element LD.

For example, the light transmission pattern LTP may include a plurality of light scattering particles dispersed in a matrix material, such as a base resin. As an example, the light transmission pattern LTP may include light scattering particles, such as silica, but the structural material of the light scattering particles is not limited thereto.

The light scattering particles do not need to be disposed only in the emission area EMA of the third subpixel SPXL3. As an example, the light scattering particles may be selectively included in the first and/or second wavelength conversion patterns WCP1 and WCP2.

The first capping layer CAP1 may seal (or cover) the wavelength conversion pattern WCP and the light transmission pattern LTP. The first capping layer CAP1 may be disposed between a low refractive index layer LRL and the display element layer DPL. The first capping layer CAP1 may be provided over the first to third subpixels SPXL1, SPXL2, and SPXL3. Accordingly, the first capping layer CAP1 may prevent impurities, such as external moisture or air, from permeating into and damaging or contaminating the color conversion unit CCL.

According to embodiments, the first capping layer CAP1 may be formed as a single layer or a multi-layer structure including at least one insulating material selected from silicon oxide ($SiO_x$), silicon nitride ($SiN_x$), silicon oxynitride ($SiO_xN_y$), aluminum oxide ($AlO_x$), and titanium oxide ($TiO_x$), but the present disclosure is not limited thereto.

The optical layer OPL may include the low refractive index layer LRL and a second capping layer CAP2. The optical layer OPL may be disposed on the color conversion unit CCL. The optical layer OPL may be disposed on the display element layer DPL.

The low refractive index layer LRL may be disposed between the first capping layer CAP1 and the second capping layer CAP2. The low refractive index layer LRL may be disposed between the color conversion unit CCL and the color filter unit CFL. The low refractive index layer LRL may be provided over the first to third subpixels SPXL1, SPXL2, and SPXL3.

The low refractive index layer LRL may improve light efficiency by recycling light provided from (e.g., emitted through) the color conversion unit CCL through total reflection. To this end, the low refractive layer LRL may have a relatively low refractive index as compared with the color conversion unit CCL.

According to embodiments, the low refractive index layer LRL may include a base resin and hollow particles dispersed in the base resin. The hollow particles may include hollow silica particles. In some embodiments, the hollow particles may be pores formed by porogen, but the present disclosure is not necessarily limited thereto. In addition, the low refractive layer LRL may include at least one selected from zinc oxide (ZnO) particles, titanium dioxide ($TiO_2$) particles, and nano silicate particles, but the present disclosure is not necessarily limited thereto.

The second capping layer CAP2 may be disposed on the low refractive index layer LRL. The second capping layer CAP2 may be disposed between the color filter unit CFL and the low refractive index layer LRL. The second capping layer CAP2 may be provided over the first to third subpixels SPXL1, SPXL2, and SPXL3. The second capping layer CAP2 may prevent impurities, such as external moisture or air from permeating into and damaging or contaminating the low refractive index layer LRL.

According to embodiments, the second capping layer CAP2 may be formed as a single layer or a multi-layer structure including at least one insulating material selected from silicon oxide ($SiO_x$), silicon nitride ($SiN_x$), silicon oxynitride ($SiO_xN_y$), aluminum oxide ($AlO_x$), and titanium oxide ($TiO_x$), but the present disclosure is not limited thereto.

The color filter unit CFL may be disposed on the second capping layer CAP2. The color filter unit CFL may be provided over the first to third subpixels SPXL1, SPXL2, and SPXL3. The color filter unit CFL may include color filters CF1, CF2, and CF3, and a planarization film PLA.

According to embodiments, the color filters CF1, CF2, and CF3 may be disposed on the second capping layer CAP2. The color filters CF1, CF2, and CF3 may overlap the emission area EMA of the first to third subpixels SPXL1, SPXL2, and SPXL3 when viewed in a plan view.

According to embodiments, a first color filter CF1 may transmit light having the first color and may not transmit light having the second color and light having the third color. As an example, the first color filter CF1 may include a colorant related to the first color.

According to embodiment, a second color filter CF2 may transmit light having the second color and may not transmit light having the first color and light having the third color. As an example, the second color filter CF2 may include a colorant related to the second color.

According to embodiments, a third color filter CF3 may transmit light having the third color and may not transmit light having the first color and light having the second color. As an example, the third color filter CF3 may include a colorant related to the third color.

According to embodiments, the planarization film PLA may be disposed on the color filters CF1, CF2, and CF3. The planarization film PLA may cover the color filters CF1, CF2, and CF3. The planarization film PLA may offset (or planarize) a step difference caused by the color filters CF1, CF2, and CF3. The planarization film PLA may be provided over the color filters CF1, CF2, and CF3.

According to an example, the planarization film PLA may include an organic material, such as an acrylic-based resin, an epoxy resin, a phenolic resin, a polyamide-based resin, a polyimide-based resin, a polyester-based resin, a polyphenylene sulfide-based resin, or benzocyclobutene (BCB). However, the present disclosure is not necessarily limited thereto, and the planarization film PLA may include at least one selected from various types of inorganic materials, such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The overcoat layer OC may be disposed on the planarization film PLA. The overcoat layer OC may be disposed between the outer film layer UFL and the color filter unit CFL. The overcoat layer OC may be provided over the first to third subpixels SPXL1, SPXL2, and SPXL3. The overcoat layer OC may cover a lower member including the color filter unit CFL. The overcoat layer OC may prevent moisture or air from penetrating into the above-described lower member(s). In addition, the overcoat layer OC may protect the above-described lower member(s) from foreign materials, such as dust.

According to embodiments, the overcoat layer OC may include an organic material, such as an acrylic-based resin, an epoxy resin, a phenolic resin, a polyamide-based resin, a polyimide-based resin, a polyester-based resin, a polyphenylene sulfide-based resin, or benzocyclobutene (BCB). However, the present disclosure is not necessarily limited thereto, and the overcoat layer OC may include at least one selected from various types of inorganic materials, such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The outer film layer UFL may be disposed on the color filter unit CFL. The outer film layer UFL may be disposed at an outer portion of the display device DD to reduce external influence on the display device DD. The outer film layer UFL may be provided over the first to third subpixels SPXL1, SPXL2, and SPXL3.

According to an embodiment, the outer film layer UFL may include an anti-reflective coating (AR coating) layer. The AR coating layer may refer to a component in which a material having an anti-reflection function is applied on one surface of a specific component. The applied material may have a low reflectance. According to an example, a material used in the AR coating layer may include at least one selected from silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the present disclosure is not limited thereto, and various known materials may be applied.

The structure of the pixel PXL is not necessarily limited to the above-described example. For example, according to embodiments, the color conversion unit CCL may be disposed not to be coplanar with the display element layer DPL.

Hereinafter, a method of manufacturing a display device DD according to an embodiment will be described with reference to FIGS. 7 to 12. Contents overlapping above-described contents may be simplified or omitted FIGS. 7 to 12 are views illustrating processes of a method of manufacturing a display device according to an embodiment.

Figure 7:
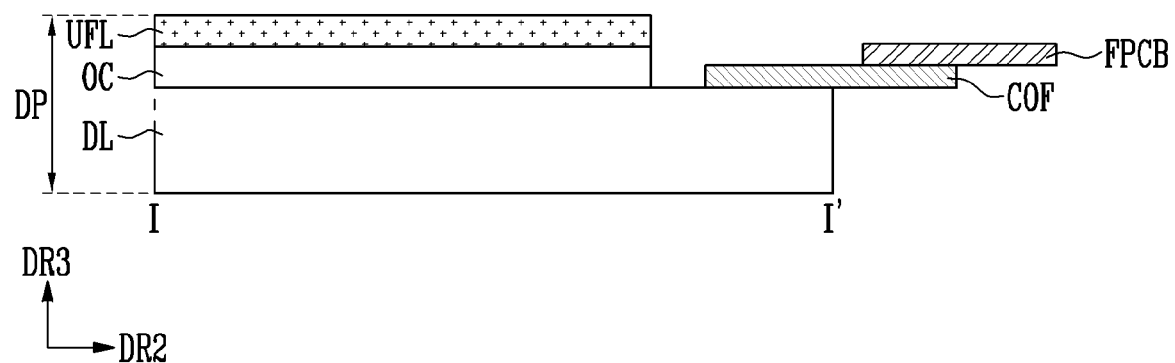
FIGS. 7 to 12 are views illustrating processes of a method of manufacturing a display device according to an embodiment.

First, referring to FIG. 7, a display layer DL may be provided (or prepared), one end of a chip-on-film COF may be connected (or attached) to one area of the display layer DL, an overcoat layer OC may be disposed (or provided) to overlap at least a portion of another area of the display layer DL, and an outer film layer UFL may be disposed (or provided) on the overcoat layer OC.

To provide the display layer DL, a pixel circuit layer PCL and a display element layer DPL may be disposed (or provided) on a substrate SUB. According to an example, individual components of the pixel circuit layer PCL may be formed by performing a process using a mask to pattern a conductive layer, an inorganic material, or an organic material. After the pixel circuit layer PCL is provided, light-emitting elements LD may be disposed. According to embodiments, the light-emitting elements LD may be disposed using an inkjet process.

A sequence relationship between a timing of providing the overcoat film OC and the outer film layer UFL and a timing of providing the chip-on-film COF and a flexible circuit board FPCB is not limited to a specific example.

Figure 8:
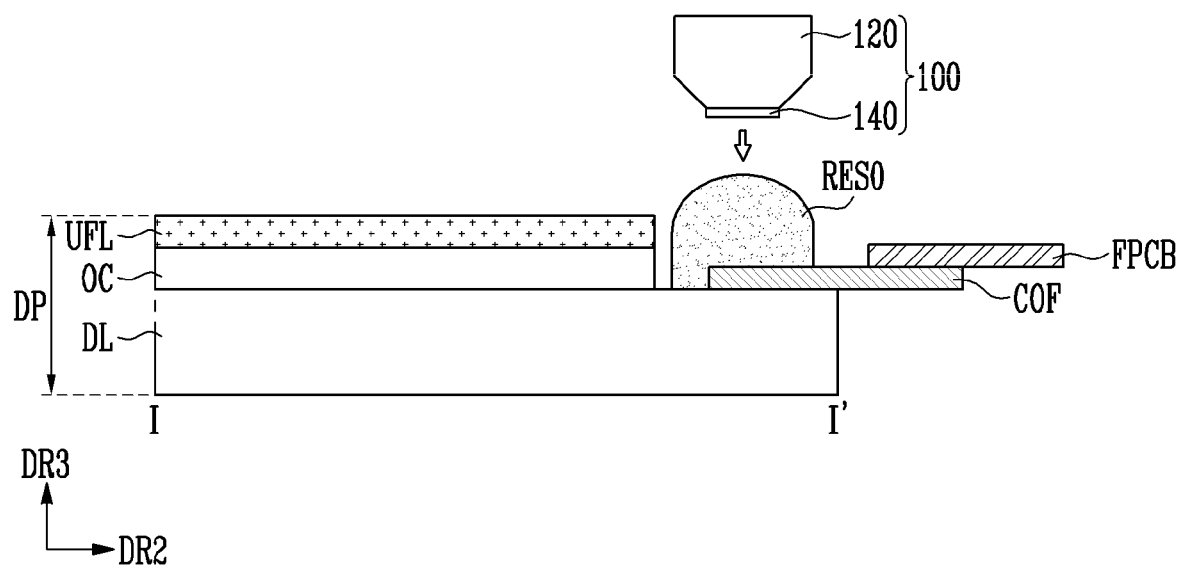

Referring to FIG. 8, a base resin RES0 may be disposed (or provided or deposited) on the display layer DL.

The base resin RES0 may be provided on the display layer DL by using a resin providing unit 100. According to embodiments, the resin providing unit 100 may include a resin storage unit 120 and a resin output unit 140.

The resin storage unit 120 may include an area in which the base resin RES0 is previously prepared (or mixed) and stored. The resin output unit 140 is configured to output the base resin RES0 and may include a nozzle through which the base resin RES0 is released. However, the configuration of the resin providing unit 100 is not limited to a specific example, and any suitable device capable of releasing a resin may be used to provide the base resin RES0.

The base resin RES0 may be disposed to cover at least a portion of the chip-on-film COF attached onto the display layer DL. According to embodiments, the base resin RES0 may be spaced apart from the outer film layer UFL at a current time point (e.g., when it is initially deposited). The base resin RES0 may be further spaced apart from the display layer DL than the outer film layer UFL.

According to embodiments, the base resin RES0 may protrude in a thickness direction of the display layer DL (e.g., a third direction DR3 in FIG. 8).

In the present operation, an amount of the base resin RES0 to be provided may be appropriately determined according to an amount (e.g., a thickness or a height) of a resin part RES to be formed on the display layer DL.

Figure 9:
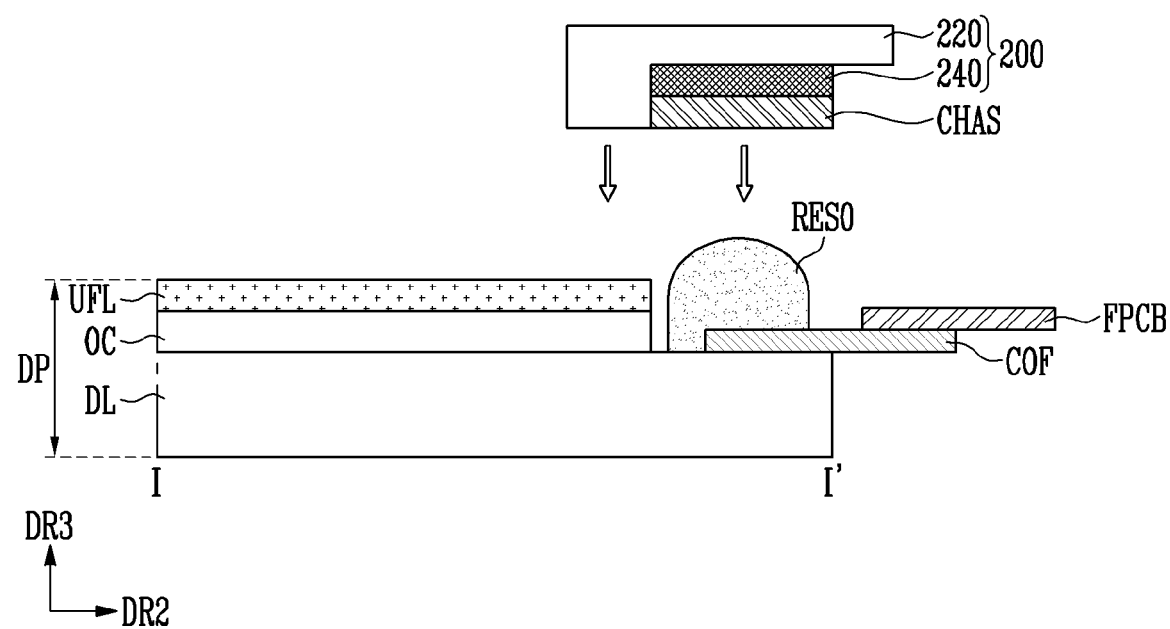

Referring to FIG. 9, a chassis part CHAS may be provided.

A chassis providing unit 200 for providing the chassis part CHAS may be used. The chassis providing unit 200 may include a guide jig 220 and an electromagnet 240.

According to embodiments, the guide jig 220 may guide a position at which the chassis part CHAS is disposed. The guide jig 220 may restrict movement of the chassis part CHAS in one direction (e.g., a direction in which the chassis part CHAS extends). For example, movement (or motion) of the chassis part CHAS in one direction may be restricted by the guide jig 220. Accordingly, the chassis part CHAS may not overlap (or may not excessively overlap) the outer film layer UFL.

According to embodiments, the guide jig 220 may be connected to the electromagnet 240. The guide jig 220 may include a concave area (or an accommodation area) to accommodate the electromagnet 240 and the chassis part CHAS. The guide jig 220 may have a shape in which at least a portion thereof extends in one direction and at least another portion thereof extends in another direction. The guide jig 220 may include a material having a rigid property, but the present disclosure is not limited to a specific example.

According to embodiments, the electromagnet 240 may include an electromagnet. An electromagnet may refer to a material that forms a magnetic field when an electric current is provided (or applied) thereto. Accordingly, the electromagnet 240 may exhibit magnetism when a current is provided thereto in a first state and may not exhibit magnetism when a current is blocked in a second state. According to embodiments, an intensity of a current applied to the electromagnet 240 may be controlled to change a magnetic intensity exhibited by the electromagnet 240.

According to embodiments, one surface of the electromagnet 240 may be connected to the guide jig 220. One surface of the electromagnet 240 may contact the guide jig 220. The other surface of the electromagnet 240 may be connected to the chassis part CHAS. According to embodiments, the other surface of the electromagnet 240 may contact the chassis part CHAS. However, the present disclosure is not limited thereto. For example, a separate member that does not substantially block a magnetic force may be provided between the electromagnet 240 and the chassis part CHAS.

According to embodiments, when the electromagnet 240 exhibits magnetism (e.g., in the first state), the chassis part CHAS may be accommodated (or coupled) to the chassis providing unit 200 by the electromagnet 240. For example, when the electromagnet 240 is in the first state, a position of the chassis part CHAS may be fixed with respect to the chassis providing unit 200. When the electromagnet 240 does not exhibit magnetism (e.g., in the second state), the chassis part CHAS may be disconnected from the chassis providing unit 200.

The chassis providing unit 200 accommodating the chassis part CHAS may be moved toward the display panel DP. Accordingly, a distance between the chassis part CHAS and the base resin RES0 may be decreased. For example, the chassis providing unit 200 may be moved downwardly in a state in which a position of the display panel DP is fixed. The chassis providing unit 200 may be moved by a separately provided device, such as a robot or robotic arm.

In the present operation, while the chassis providing unit 200 is moved toward the display panel DP, the electromagnet 240 may be in the first state and exhibits magnetism. Accordingly, the position of the chassis part CHAS may be fixed with respect to the chassis providing unit 200 to not be changed.

Figure 10:
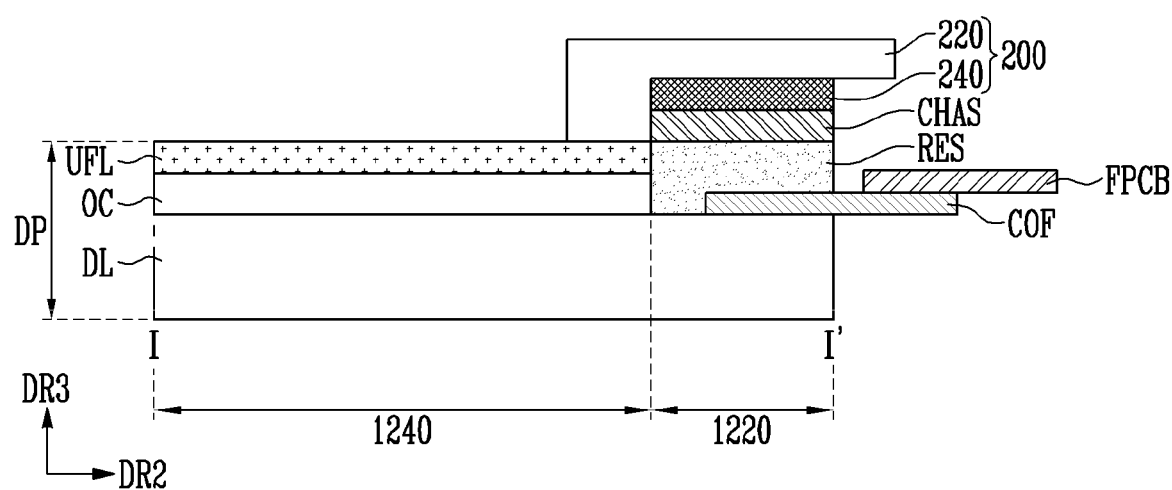

Referring to FIG. 10, the chassis part CHAS may transform (e.g., may collapse or form) the base resin RES0, and the resin part RES may be provided.

In this step, the chassis part CHAS may contact the base resin RES0. Accordingly, a physical shape of the base resin RES0 may be transformable.

For example, a shape of the base resin RES0 may be transformed and provided as the resin part RES. An upper surface of the resin part RES may be formed to correspond to the chassis part CHAS.

The electromagnet 240 may still be in the first state. Accordingly, the chassis part CHAS may be accommodated in the chassis providing unit 200.

At this time, a first area 1220 corresponding to the position of the chassis part CHAS and a second area 1240 outside the first area 1220 may be provided (or defined).

The guide jig 220 may limit the position of the chassis part CHAS, thereby preventing the chassis part CHAS from being provided at an unintended position.

A magnetic intensity of the electromagnet 240 may be appropriately changed (or varied). According to embodiments, the magnetic intensity of the electromagnet 240 may be controlled to adjust the position of the chassis part CHAS. The electromagnet 240 may closely control the position of the chassis part CHAS in the third direction DR3. For example, as described above, the strength of the current provided to the electromagnet 240 may be adjusted to adjust its magnetic intensity. In the present operation, the base resin RES0 is pushed to an appropriate height and transformed. According to embodiments, the magnetic intensity of the electromagnet 240 may be precisely controlled so that the chassis part CHAS may push the base resin RES0 to an intended height. As a result, according to the embodiment, the positions of the resin part RES and the chassis part CHAS may be closely controlled.

According to embodiments, the chassis part CHAS may have a plate shape. According to the related art, because the chassis part CHAS is provided on the base resin RES0, which has a fluid or fluid-like property (e.g., has a shape transformable according to an external force), it is difficult to closely adjust a position of the chassis part CHAS. To compensate, in the related art, the chassis part CHAS has needed to have a curved shape. However, according to embodiments, because the position of the chassis part CHAS can be closely controlled by using the electromagnet 240, the chassis part CHAS may have the plate shape, and the shape of the chassis part CHAS may be appropriately selected according to the intention of a manufacturer (or a user).

Figure 11:
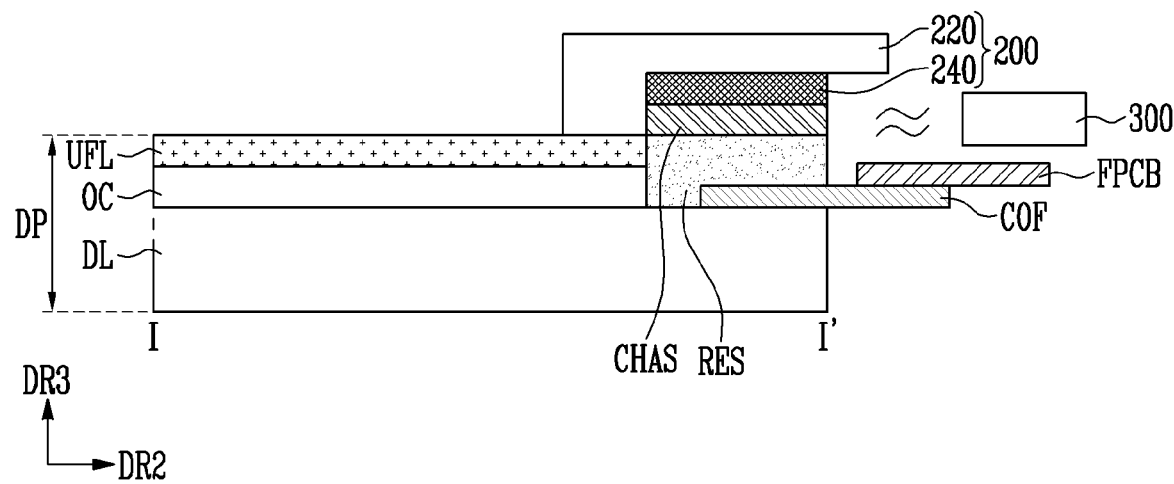

Referring to FIG. 11, the resin part RES may be cured.

A resin curing device 300 configured to provide ultra violet (UV) may be used. For example, the resin curing device 300 may provide UV to the resin part RES, which has a shape defined by the chassis part CHAS, thereby allowing the resin part RES to have a desired shape.

According to embodiments, the chassis part CHAS may contact the upper surface of the resin part RES. According to embodiments, the position of the chassis part CHAS may be controlled to not be changed, thereby preventing the shape of the resin part RES from being transformed until the resin part RES is cured by the resin curing device 300.

For example, the position of the chassis part CHAS may be fixed by the electromagnet 240 and may not be changed until the resin part RES is cured. Accordingly, the shape of the resin part RES may not be distorted by a load of the chassis part CHAS. As a result, the shape of the resin part RES may be easily provided as intended.

Figure 12:
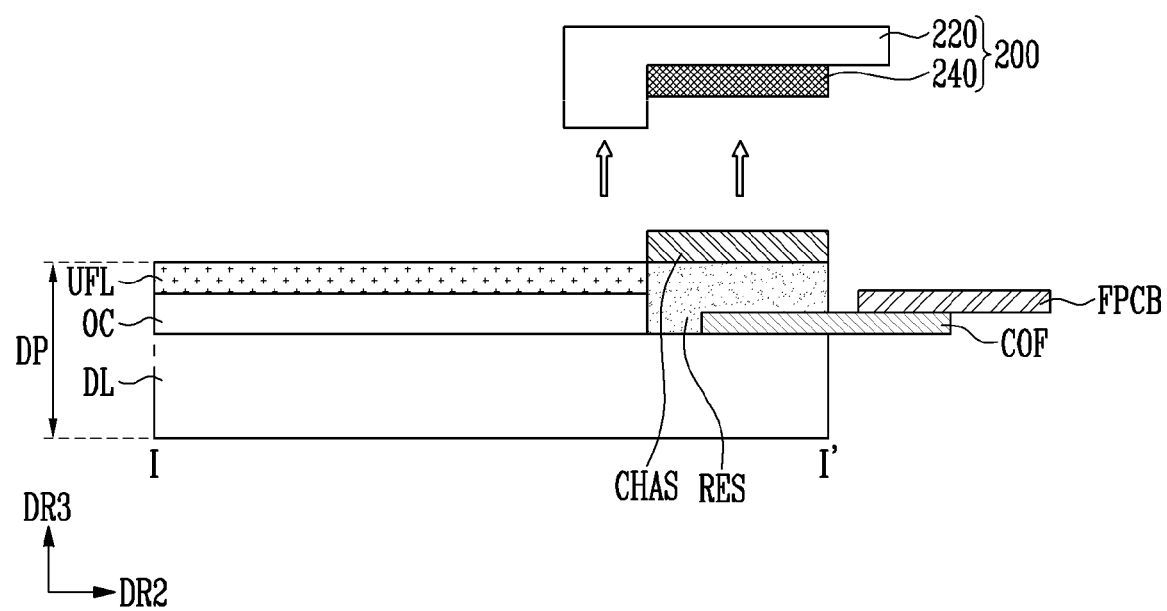

Referring to FIG. 12, the chassis providing unit 200 may be separated from the display panel DP.

The electromagnet 240 may be in the second state. The electromagnet 240 may not exhibit enough magnetism to be coupled to the chassis part CHAS. An amount of current provided to the electromagnet 240 may be decreased so its magnetic intensity may be decreased or may not be substantially provided. Accordingly, coupling between the chassis part CHAS and the electromagnet 240 may be released.

The resin part RES and the chassis part CHAS may be provided in states of being attached to each other. The resin part RES may be attached to the chassis part CHAS.

Thereafter, the chip-on-film COF is bent to connect the flexible circuit board FPCB to a rear surface of the display layer DL, thereby providing the display device DD as shown in, for example, FIGS. 1 and 2.

Hereinafter, a method of manufacturing a display device DD according to another embodiment will be described with reference to FIGS. 13 to 15. Contents overlapping above-described contents may be simplified or omitted, and differences will be primarily described.

Figure 13:
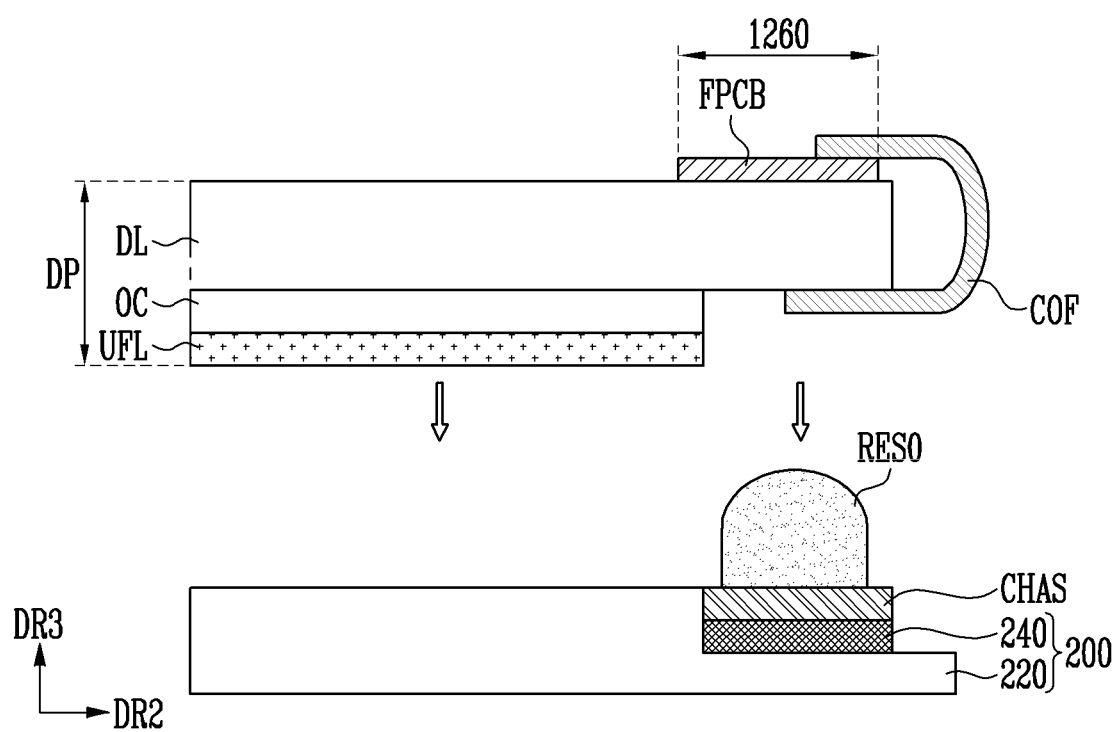
FIGS. 13 to 15 are views illustrating processes of a method of manufacturing a display device according to another embodiment.
Figure 14:
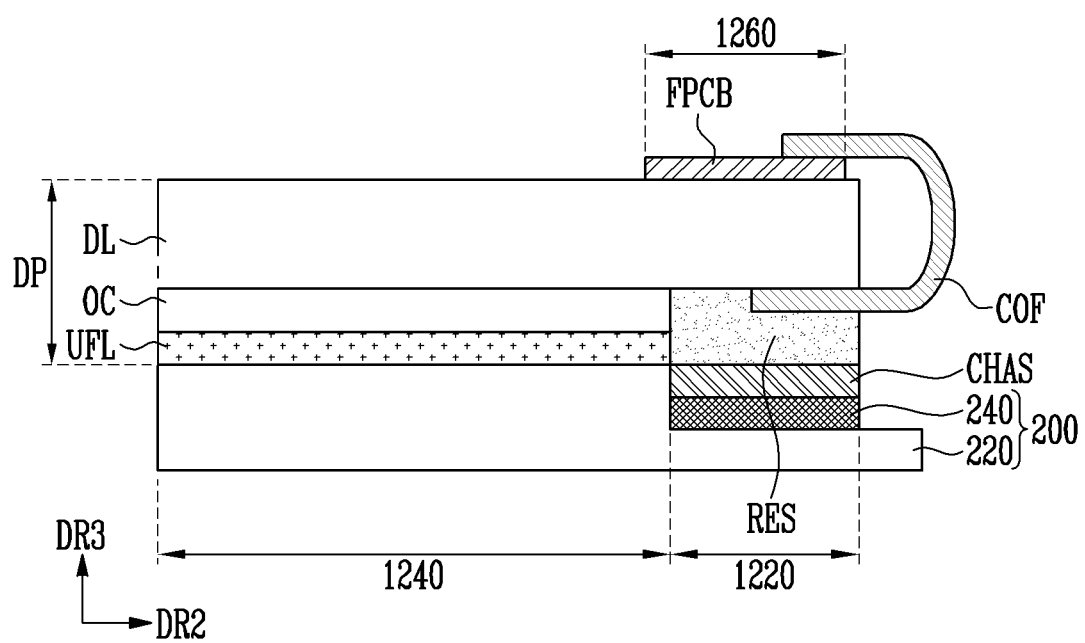
Figure 15:
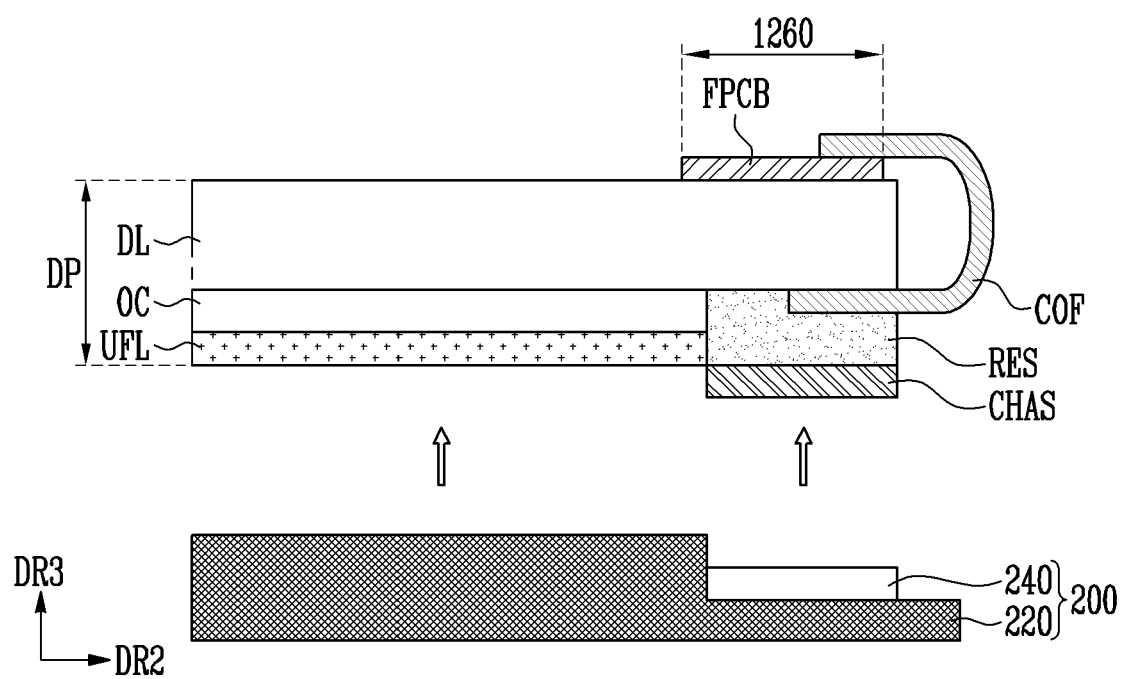

FIGS. 13 to 15 are views of processes of the method of manufacturing a display device according to the other embodiment.

The method of manufacturing the display device DD according to the embodiment shown in FIGS. 13 to 15 is different from the method of manufacturing the display device DD according to the first embodiment shown in FIGS. 7 to 12 in that, in a state in which a position of a chassis providing unit 200 is fixed, a display panel DP is moved to provide a resin part RES.

Referring to FIG. 13, a base resin RES0 may be provided (prepared, disposed, or deposited) on one surface of a chassis part CHAS accommodated in the chassis providing unit 200. Because the display panel DP is moved to the chassis providing unit 200, a spacing distance between the display panel DP (or a display layer DL) and the chassis providing unit 200 may be decreased.

Based on the gravitational direction, the chassis providing unit 200 may be disposed under the display panel DP (or the display layer DL). One surface of the chassis part CHAS may be exposed in a direction opposite to the direction of gravity (e.g., a third direction DR3 in FIG. 13).

Based on the gravitational direction of gravity an outer film layer UFL of the display panel DP may be disposed to face the chassis providing unit 200, and the display layer DL may be disposed to face in a direction opposite to the direction of gravity (e.g., the third direction DR3 in FIG. 13). For example, an overcoat layer OC and the outer film layer UFL may be closer to the chassis providing unit 200 than the display layer DL.

A chip-on-film COF and a flexible circuit board FPCB may be provided in a temporarily attached state. The temporarily attached state may refer to a state of not being excessively (or permanently) coupled, physically or chemically, and may refer to a state of be selectively separable according to a subsequent process.

According to embodiments, the flexible circuit board FPCB may be attached to the display layer DL at a temporary attachment area 1260. Experimentally, when the display panel DP (or the display layer DL) is moved, the flexible circuit board FPCB may be provided to be movable when not fixed at a separate position, and thus, a position of the resin part RES may be inappropriately defined. To prevent such a problem, because the chip-on-film COF and the flexible circuit board FPCB are provided at positions in a temporarily attached state, even when the display panel DP (or the display layer DL) is moved, individual components may not be disposed incorrectly.

The base resin RES0 may be provided to be disposed on one surface of the chassis part CHAS. Thereafter, the display panel DP is lowered in a state in which the chip-on-film COF and the flexible circuit board FPCB are temporarily attached, and thus, a spacing distance between the display panel DP (or the display layer DL) and the chassis providing unit 200 may be decreased.

Referring to FIG. 14, the chassis part CHAS may transform the base resin RES0 to provide the resin part RES.

A first area 1220 and a second area 1240 may be defined. In addition, in a state in which the chassis part CHAS is in contact with the resin part RES, the resin part RES may be cured by a resin curing device 300 (as described above).

Referring to FIG. 15, the display panel DP (or the display layer DL) may be separated from the chassis providing unit 200. The display panel DP (or the display layer DL) and the chassis providing unit 200 may be separated from each other, and the chassis part CHAS may be provided in a state of being attached to the resin part RES.

When the chip-on-film COF and the flexible circuit board FPCB are provided in the temporarily attached state, the display panel DP (or the display layer DL) may be disconnected from the chassis providing unit 200. For example, only after the display panel DP and the chassis providing unit 200 are separated from each other, the chip-on-film COF and the flexible circuit board FPCB may be released from the temporarily attached state.

According to embodiments, when the display panel DP (or the display layer DL) is separated from the chassis providing unit 200, an electromagnet 240 may not exhibit magnetism. Accordingly, the chassis part CHAS may be disconnected from the electromagnet 240 in a state of being connected (or attached) to the resin part RES.

Thereafter, the flexible circuit board FPCB may be released from the temporary attachment area 1260. Based on the gravitational direction, the display panel DP provided in an inverted orientation may be disposed such that the display layer DL faces in the gravitational direction, and the flexible circuit board FPCB may be attached at a normal position, thereby providing the display device DD as shown in, for example, FIGS. 1 and 2.

According to an embodiment of the present disclosure, a method of manufacturing a display device is provided, that exhibits improved process efficiency and close controlling positions of individual component, and a display device manufactured using the same is also provided.

According to another embodiment of the present disclosure, a method of manufacturing a display device is provided in which a chassis part is applicable to a structure in which a substrate is not provided outside a display surface, and a display device manufactured using the same is also provided.

Aspects and features of the present disclosure are not be limited to those described above, and other aspects and features of the present disclosure will be clearly understood by those having ordinary skill in the art from the disclosures provided below together with accompanying drawings.

Aspects and feature of the present disclosure have been described by way of example. It will be appreciated by those skilled in the art that various modifications, changes, and substitutions can be made without departing from the present disclosure. Therefore, the embodiments of the present disclosure described above may be implemented independently or in combination with each other.

Therefore, the embodiments disclosed in the present disclosure do not limit the scope of the present disclosure but explain the present disclosure, and the technical scope of the present disclosure is not be limited by the embodiments. The scope of the present disclosure should be construed based on the accompanying claims and their equivalents.

What is claimed is:

1. A method of manufacturing a display device, the method comprising:
   providing a display layer comprising a light-emitting element;
   providing a base resin on the display layer;
   providing a chassis part using a chassis providing unit comprising an electromagnet;
   providing a resin part by transforming a shape of the base resin; and
   separating the chassis providing unit from the display layer.

2. The method of claim 1, wherein the electromagnet is configured to have a first state having magnetism and a second state having no magnetism,
   wherein the electromagnet is in the first state during the providing of the chassis part, and
   wherein the electromagnet is in the second state during the separating of the chassis providing unit from the display layer.

3. The method of claim 2, further comprising curing the resin part, wherein, in the curing of the resin part, the electromagnet is in the first state such that a position of the chassis part is fixed.

4. The method of claim 1, wherein the providing of the resin part comprises bringing the chassis part and the base resin into contact with each other.

5. The method of claim 4, wherein the bringing of the chassis part and the base resin into contact with each other comprises changing a magnetic intensity of the electromagnet.

6. The method of claim 1, further comprising providing a chip-on-film and a flexible circuit board on the display layer,
wherein a portion of the chip-on-film is connected to the display layer, and another portion of the chip-on-film is connected to the flexible circuit board, and
wherein the providing of the base resin comprises allowing the base resin and the chip-on-film to overlap each other when viewed in a plan view.

7. The method of claim 6, wherein the display layer has a first area and a second area other than the first area, and
wherein, when viewed in a plan view, the display layer overlaps the chip-on-film, the resin part, and the chassis part in the first area and does not overlap the chip-on-film, the resin part, and the chassis part in the second area.

8. The method of claim 1, wherein the chassis part has a plate shape without a bending area.

9. The method of claim 1, wherein the chassis part comprises at least one selected from aluminum and magnesium.

10. The method of claim 1, wherein the chassis part has a thickness of 100 μm or less.

11. The method of claim 1, wherein an overcoat layer and an outer film layer are on the display layer, and
wherein the resin part does not overlap the outer film layer when viewed in a plan view.

12. The method of claim 1, wherein one surface of the chassis part and one surface of the resin part are formed to be complementary to each other.

13. The method of claim 1, wherein the chassis providing unit further comprises a guide jig having a portion extending in one direction and another portion extending in another direction.

14. The method of claim 13, wherein the guide jig is configured to restrict movement of the chassis part in the one direction.

15. A method of manufacturing a display device, the method comprising:
providing a display layer comprising a light-emitting element;
accommodating a chassis part in a chassis providing unit, the chassis providing unit comprising a guide jig and an electromagnet;
providing a base resin on the chassis part;
moving the display layer in a gravitational direction to be adjacent to the base resin and transforming a shape of the base resin to provide a resin part; and
separating the display layer from the chassis providing unit.

16. The method of claim 15, further comprising providing an overcoat layer and an outer film layer on the display layer,
wherein, when the display layer is moved in the gravitational direction, the overcoat layer and the outer film layer are closer to the chassis providing portion than the display layer.

17. The method of claim 15, further comprising providing a chip-on-film and a flexible circuit board on the display layer,
wherein, before the providing of the resin part, the base resin and the chip-on-film are spaced apart from each other.

18. The method of claim 17, further comprising, before the separating of the display layer from the chassis providing unit, temporarily attaching the chip-on-film onto a rear surface of the display layer.

19. A display device manufactured according to the method of claim 15.

20. A display device having a plurality of sides, the display device comprising:
a display layer on a substrate, the substrate having a first area and a second area, the display layer comprising a light-emitting element;
an outer film layer on the display layer;
a flexible circuit board configured to output an electrical signal to the display layer;
a chip-on-film having one end connected to the first area and another end connected to the flexible circuit board;
a resin part overlapping the chip-on-film in the first area and at least partially overlapping the outer film layer; and
a chassis part overlapping the resin part in the first area, the chassis part comprising metal and being adjacent to one of the plurality of sides of the display device,
wherein the chassis part has a plate shape and does not have a bending area.

* * * * *